(12) United States Patent
Pan et al.

(10) Patent No.: US 7,821,010 B2
(45) Date of Patent: Oct. 26, 2010

(54) LOW TEMPERATURE FABRICATION OF CONDUCTIVE MICRO STRUCTURES

(75) Inventors: Shaoher X. Pan, San Jose, CA (US); Chii Guang Lee, Fremont, CA (US)

(73) Assignee: Spatial Photonics, Inc., Sunnyvale, CA (US)

( * ) Notice: Subject to any disclaimer, the term of this patent is extended or adjusted under 35 U.S.C. 154(b) by 712 days.

(21) Appl. No.: 11/427,272

(22) Filed: Jun. 28, 2006

(65) Prior Publication Data

US 2008/0003784 A1 Jan. 3, 2008

(51) Int. Cl.
H01L 27/14 (2006.01)
H01L 29/04 (2006.01)
H01L 29/15 (2006.01)
H01L 31/036 (2006.01)
H01L 29/78 (2006.01)

(52) U.S. Cl. .......................... 257/72; 257/414; 257/415; 257/E29.166

(58) Field of Classification Search .................... 257/72, 257/709, 414, 415, 773, E21.09, E29.003, 257/E29.166
See application file for complete search history.

(56) References Cited

U.S. PATENT DOCUMENTS

| 5,665,997 | A | 9/1997 | Weaver et al. |
|---|---|---|---|
| 6,356,378 | B1 | 3/2002 | Huibers |
| 6,469,821 | B2 | 10/2002 | Bartlett et al. |
| 6,487,001 | B2 | 11/2002 | Greywall |
| 6,819,470 | B2 | 11/2004 | Meier et al. |
| 6,870,659 | B2 | 3/2005 | Aubuchon |
| 6,914,711 | B2 | 7/2005 | Novotney et al. |
| 6,992,810 | B2 | 1/2006 | Pan et al. |
| 7,148,603 | B1 | 12/2006 | Garcia et al. |
| 7,167,298 | B2 | 1/2007 | Pan |
| 7,245,415 | B2 | 7/2007 | Pan |
| 2004/0240033 | A1 | 12/2004 | Pan et al. |
| 2005/0128564 | A1* | 6/2005 | Pan ............................. 359/291 |
| 2006/0276015 | A1* | 12/2006 | Morris ........................ 438/542 |

OTHER PUBLICATIONS

Roya Maboudian, "Surface processes in MEMS technology", 1998, Surface Science Reports 30, pp. 207-268.
USPTO Final Office Action in U.S. Appl. No. 11/936,711, mailed Sep. 22, 2009, 7 pages.

* cited by examiner

Primary Examiner—Walter L Lindsay, Jr.
(74) Attorney, Agent, or Firm—Fish & Richardson P.C.

(57) ABSTRACT

A method of fabricating a micro structure includes depositing amorphous silicon over a substrate having an electric circuit at a temperature below 550° C. to form a first structure portion, wherein at least part of the first structure portion is configured to receive an electrical signal from the electric circuit.

4 Claims, 16 Drawing Sheets

LOW TEMPERATURE FABRICATION OF CONDUCTIVE MICRO STRUCTURES

BACKGROUND

The present disclosure relates to the fabrication of micro structures and micro devices.

Micro electrical mechanical devices (MEMS) are often fabricated using planar micro fabrication technologies that usually build micro structures in layers over a substrate in a bottom up manner. The lower layers are deposited and processed, followed by the upper layers. Three dimensional structures can be formed over the substrate by common micro fabrication techniques such as deposition, photo masking, etching, polishing, cleaning, and the use of sacrificial materials.

MEMS often include an electronic circuit for controlling the micro structures. The electronic circuit is usually first fabricated in the substrate. The micro structures are then built over the substrate already containing the electronic circuit. For example, a tiltable micro mirror can be built over a substrate having an electronic circuit for controlling the mirror or a control circuit, in the substrate. The mirror plate of the tiltable mirror includes a reflective upper surface as the mirror surface for reflecting incident light. The control circuit is electrically connected with a conductive surface on the mirror plate and an electrode on the substrate. The tiltable mirror can tilt when the control circuit applies an electric potential between the conductive surface and the surface electrode. The control circuit is often fabricated in one or more layers of complementary metal oxide semiconductor (CMOS) materials.

The above described micro-structure fabrication process can include several challenges. First, the CMOS circuit can suffer heat damages if subsequent processing steps involve temperatures higher than 500° C. In addition, the micro structure often includes a conductive portion to allow the voltage of the conductive portion to be externally controlled, as exemplified by the tiltable micro mirror described above. Furthermore, the applications of the micro structures can impose other constraints in material selection and the fabrication process. For example, some tiltable micro mirrors require high reflectance at the upper surface of the mirror plate but have minimal reflections and scatterings from other surfaces to reduce optical noise and enhance contrast in the image display.

SUMMARY

In one general aspect, the present invention relates to a method of fabricating a micro structure. The method includes depositing amorphous silicon over a substrate having an electric circuit at a temperature below 550° C. to form a first structure portion, wherein at least part of the first structure portion is configured to receive an electrical signal from the electric circuit.

In another general aspect, the present invention relates to a method of forming an amorphous silicon layer on a substrate. The method includes depositing amorphous silicon in a processing chamber at a temperature of between about 150° and about 400°, a pressure of 1 to 10 Torr, $SiH_4$ gas flow at a rate in the range of 20-300 sccm, $PH_3$ gas flow at a rate in the range of 20-500 sccm, Helium gas flow at a rate in the range of 2000-10000 sccm, and a RF power of 50-1200 Watts to obtain a layer of deposited silicon characterized by one or more of an electric conductivity in the range of 0.1 to 100 $\Omega^{-1}$ $cm^{-1}$, a mechanical stress between about −250 MPa and about 250 MPa, and a reflectance below 50%.

In another general aspect, the present invention relates to a method of fabricating a tiltable micro mirror plate. The method includes forming a hinge support post on a substrate having an electric circuit configured to control the movement of the tiltable micro mirror plate; disposing a sacrificial material over the substrate; depositing one or more layers of structural materials over the sacrificial material such that at least one of the one or more layers is in contact with the hinge support post, the depositing step including depositing amorphous silicon at a temperature below 550° C.; forming an opening in the one or more layers of structural materials, wherein the opening provides access from outside to the sacrificial material below the one or more layers of structural materials; and removing the sacrificial material to define the tiltable micro mirror plate.

Implementations of the methods may include one or more of the following. The step of depositing amorphous silicon can include depositing amorphous silicon by PECVD in a processing chamber. The processing conditions can include a pressure of 1 to 10 Torr in the processing chamber, $SiH_4$ gas flow at a rate in the range of 20-300 sccm, $PH_3$ gas flow at a rate in the range of 20-500 sccm, helium gas flow at a rate in the range of 2000-10000 sccm, or an RF power of 50-1200 Watt. Depositing amorphous silicon by PECVD in the processing chamber can be performed at a pressure of 1 to 10 Torr, with $SiH_4$ gas flow at a rate in the range of 20-300 sccm, $PH_3$ gas flow at a rate in the range of 20-500 sccm, helium gas flow at a rate in the range of 2000-10000 sccm, and an RF power of 50-1200 Watts. The step of depositing amorphous silicon can occur at a temperature in the range of about 150° C. to about 450° C. The method can further include forming an electrode on the substrate, wherein the first structure portion is capable of moving when an electric voltage is applied between the first structure portion and the electrode on the substrate. The method can further include providing a substrate comprising a CMOS circuit. The method can further include forming a second structure portion over the substrate using a structural material, wherein the second structure portion is connected to the first structure portion. The method can further include introducing a sacrificial material over the substrate; depositing a layer of amorphous silicon over the second structure portion and the sacrificial material; forming an opening in the layer of amorphous silicon to provide access to the sacrificial material; and removing the sacrificial material to expose the first structure portion, the second structure portion, and the lower surface of the layer of amorphous silicon, wherein at least part of the layer of amorphous silicon is separated from the substrate by an air gap.

In another general aspect, the present invention relates to a device including: a substrate having an electrical circuit; and a microelectromechanical structure on the substrate, wherein the microelectromechanical structure has a moveable portion, and at least a portion of the microelectromechanical structure is formed of an amorphous silicon that is in electrical communication with the electrical circuit.

Implementations of the device may include one or more of the following. At least a portion of the device can be characterized by one or more of an electrical conductivity in the range of 0.1 to 100 $\Omega^{-1} cm^{-1}$, a reflectance below 50%, or a mechanical stress between about −250 MPa and about 250 MPa. At least a portion of the first structure portion can be characterized by one or more of an electrical conductivity in the range of 0.5 to 100 $\Omega^{-1} cm^{-1}$, a reflectance below 40%, or a mechanical stress between about −150 MPa and about 150 MPa.

Implementations may include one or more of the following advantages. The present specification disclose methods and systems to address the above described challenges the fabrication of the micro structures. The disclose methods and systems may allow micro structures to be fabricated at temperatures below 500° C., which can prevent heat damage to the CMOS circuit in the control substrate. The micro structures can be electrically conductive, which allows the micro structures to receive electric control signals from the CMOS circuits in the control substrates. The micro structures also have low optical reflectivity, which may be required for non-mirror surfaces in optical devices such as the tiltable mirrors. Furthermore, the disclosed process conditions may produce a micro structure having minimal mechanical stress.

Although the invention has been particularly shown and described with reference to multiple embodiments, it will be understood by persons skilled in the relevant art that various changes in form and details can be made therein without departing from the spirit and scope of the invention.

DETAILED DESCRIPTION

In one example, the disclosed materials and methods are illustrated by the fabrication of spatial light modulator (SLM) based on a micro mirror array. A micro mirror array typically includes an array of cells, each of which includes a micro mirror plate that can be tilted about an axis and, furthermore, circuitry for generating electrostatic forces that tilt the micro mirror plate. In a digital mode of operation, the micro mirror plate can be tilted to stay at two positions. In an "on" position, the micro mirror plate directs incident light to form an assigned pixel in a display image. In an "off" position, the micro mirror plate directs incident light away from the display image.

A cell can include structures for mechanically stopping the micro mirror plate at the "on" position and the "off" position. These structures are referred to in the present specification as mechanical stops. The SLM operates by tilting a selected combination of micro mirrors to project light to form appropriate image pixels in a display image. A display device based on an SLM is usually required to refresh image frames at high frequencies typical of video applications. Each instance of image frame refreshing can involve the tilting of all or some of the micro mirrors to new orientations. Providing fast mirror tilt movement is therefore crucial to any functional SLM-based display device.

Figure 1A:
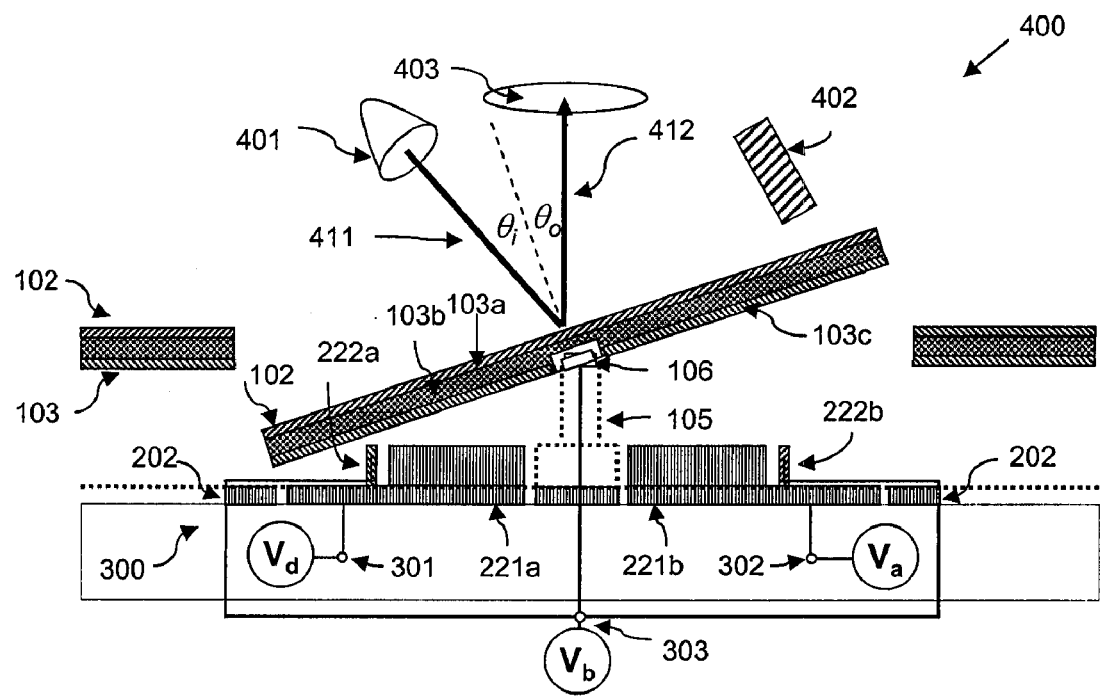
FIG. 1A illustrates a cross-sectional view of a micro mirror fabricated by the disclosed sacrificial material when the mirror plate is at an "on" state.
Figure 1B:
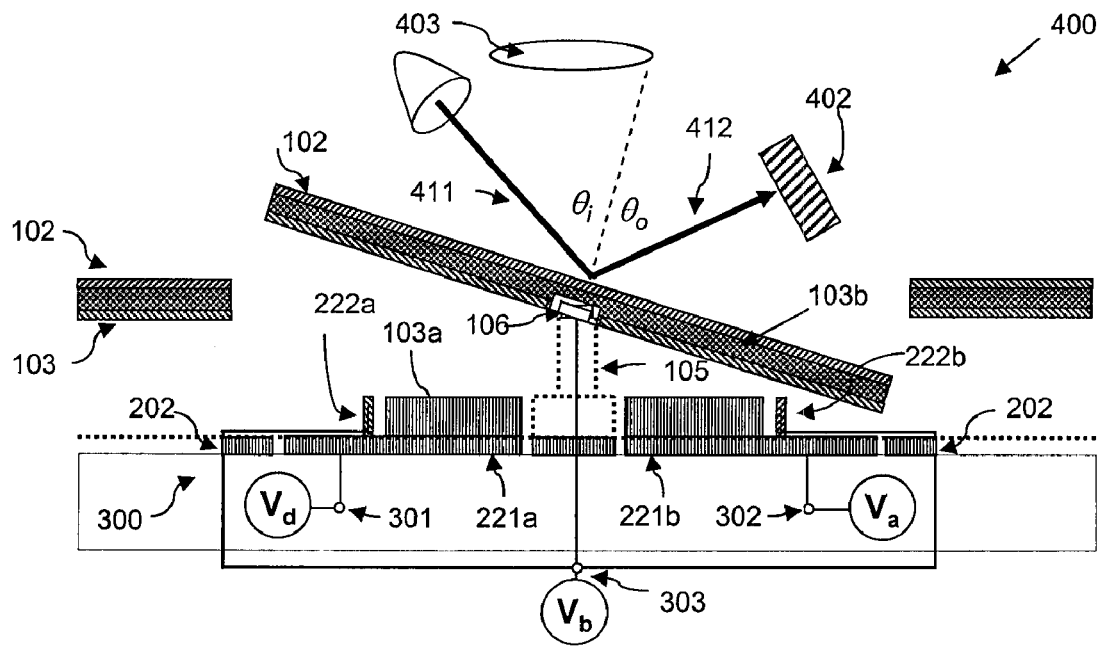
FIG. 1B illustrates a cross-sectional view of a micro mirror fabricated by the disclosed sacrificial material when the mirror plate is at an "off" state.

FIG. 1A shows a cross-sectional view of a portion of a SLM 400 wherein a micro mirror plate is in an "on" position. Incident light 411 from a source of illumination 401 is directed at an angle of incidence θi and is reflected at an angle of θo as reflected light 412 toward a display surface through a projection pupil 403. FIG. 1B shows a cross-sectional view of the same part of the spatial light modulator while the mirror plate is rotated toward another electrode under the other side of the hinge 106. The same incidental light 411 is reflected to form deflected light 412 at much larger angles θi and θo than in FIG. 1A. The angle of deflection of the deflected light 412 is predetermined by the dimensions of mirror plate 102 and the air gap spacing between a lower surface of the mirror plate 102 to springy landing tips 222a and 222b. The deflected light 412 exits toward a light absorber 402.

Referring to FIGS. 1A and 1B, the SLM 400 includes three major portions: the bottom portion of control circuitry, the middle portion of a plurality of step electrodes, landing tips, hinge support posts, and the upper portion covered with a plurality of mirror plates with hidden torsion hinges and cavities.

The bottom portion includes a control substrate 300 with addressing circuitries to selectively control the operation of the mirror plates in the SLM 400. The addressing circuitries include an array of memory cells and word-line/bit-line interconnects for communication signals. The electrical addressing circuitry on a silicon wafer substrate can be fabricated using standard CMOS technology, and resembles a low-density memory array.

The middle portion of the high contrast SLM 400 includes step electrodes 221a and 221b, landing tips 222a and 222b, hinge support posts 105, and a hinge support frame 202. The multi-level step electrodes 221a and 221b are designed to improve the capacitive coupling efficiency of electrostatic torques during the angular cross over transition. By raising the surfaces of the step electrodes 221a and 221b near the hinge 106 area, the air gap spacing between the mirror plate 102 and the step electrodes 221a and 221b is effectively narrowed. Since the electrostatic attractive force is inversely proportional to the square of the distance between the mirror plates and electrodes, this effect becomes apparent when the mirror plate is tilted at its landing positions. When operating in analog mode, highly efficient electrostatic coupling allows a more precise and stable control of the tilting angles of the individual micro mirror plate in the spatial light modulator. In a digital mode, the SLM requires much lower driving voltage potential in addressing circuitry to operate. The height differences between the first level and the second levels of the step electrodes 221a and 221b may vary from 0.2 microns to 3 microns depending on the relative height of the air gap between the first level electrodes to the mirror plate.

On the top surface of a control substrate, a pair of stationary landing tips 222a and 222b is designed to have a same height as the second level of the step electrodes 221a and 221b for manufacturing simplicity. The landing tips 222a and 222b can provide a gentle mechanical touch-down for the mirror plate to land. The landing tips 222a and 222b can precisely define the maximum angle at which the mirror plate is able to rotate. Adding a stationary landing tip 222a and 222b on the surface of the control substrate enhances the robotics of operation and prolongs the reliability of the devices. Furthermore, the landing tips 222a and 222b allow an ease of separation between the mirror plate 102 and landing tip 222a and 222b, which can overcome the contact surface adhesion during a digital operation of the SLM 400. For example, to initiate an angular cross over transition that is, to cause the mirror to tilt from on orientation to another, an abrupt bipolar pulse voltage Vb can be applied to the bias electrode 303, which is typically connected to each mirror plate 102 through a hinge 106 and hinge support posts 105. The voltage potential established by the bipolar bias Vb enhances the electrostatic forces on both side of the hinge 106. This strengthening is unequal on two sides at the landing position, due to the large difference in air gap spacing. Though the increases of bias voltages Vb on the lower surface 103c of mirror plate 102 has less impact on which direction the mirror plate 102 will rotate toward, a sharp increase of electrostatic forces F on the whole mirror plate 102 provides a dynamic excitation by converting the electromechanical kinetic energy into an elastic strain energy stored in the deformed hinges 106 and deformed landing tips 222a or 222b. After a bipolar pulse is released on the common bias Vb, the elastic strain energy of deformed landing tip 222a or 222b and the deformed hinges 106 is converted back to the kinetic energy of mirror plate as it springs and bounces away from the landing tip 222a or 222b. This perturbation of the mirror plate toward the quiescent state enables a much smaller addressing voltage potential Va for tilting the mirror plate 102 from one state to the other.

The hinge support frame 202 on the surface of control substrate 300 is designed to strengthen the mechanical stability of the pairs of hinge support posts 105, and retain the electrostatic potentials locally. For simplicity, the height of hinge support frames 202 is designed to be the same as the height of the first level of the step electrodes 221a and 221b. With a fixed size of mirror plate 102, the height of a pair of hinge support posts 105 will determine the maximum deflection angles θ of a micro mirror array.

The upper portion of the SLM 400 includes an array of micro mirrors with a flat optically reflective layer 103a on the upper surfaces and a pair of hinges 106 under the cavities in the lower portion of mirror plate 102. A pair of hinges 106 in the mirror plate 102 are fabricated to be part of the mirror plate 102 and is kept a minimum distance under the reflective surface to allow only a gap for a pre-determined angular rotation. By minimizing the distances between the rotational axis defined by the pair of hinges 106 to the upper reflective surfaces 103a, the SLM effectively eliminates the horizontal displacement of each mirror plate during an angular transition. In some implementations, the gaps between adjacent mirror plates in the array of the SLM are reduced to less than 0.2 microns to achieve a high active reflection area fill-ratio.

The structural materials used for the SLM 400 are preferably electrically conductive and stable, with suitable hardness, elasticity, and stress. Ideally a single material can provide both the stiffness required of the mirror plate 102 and the plasticity required of the hinges 106. That is, the material ought to have sufficient strength to deflect without fracturing. In the present specification, such structural material is called electromechanical material. Furthermore, the materials used in constructing the micro mirror array after the fabrication of the control circuitry may be processed at temperatures below 500° C., a typical process temperature range, without damaging the pre-fabricated circuitries in the control substrate.

In the implementation shown in FIGS. 1A and 1B, the mirror plate 102 includes three layers. A reflective top layer 103a is made of aluminum and is typically about 600 angstrom thick. A middle layer 103b can be made of a silicon based material, for example, amorphous silicon, typically about 2000 to 5000 angstrom in thickness. A bottom layer 103c is made of titanium and is typically about 600 angstrom thick. As can be seen from FIGS. 1A and 1B, the hinge 106 can be implemented as part of the bottom layer 103c. The mirror plate 102 can be fabricated as described below.

According to an alternative embodiment, the materials of the mirror plates 102, hinges 106, and the hinge support posts 105 can be one of aluminum, silicon, polysilicon, amorphous silicon, or an aluminum-silicon alloy. The material can be deposited by physical vapor deposition (PVD) magnetron sputtering a single target containing either or both aluminum and silicon in a controlled chamber with temperature below 550° C. Same structure layers may also be formed by PECVD.

According to an alternative embodiment, the mirror plates 102, the hinges 106, and the hinge support posts 105 can be made of materials such as silicon, polysilicon, amorphous silicon, aluminum, titanium, tantalum, tungsten, molybdenum, and silicides or alloys of aluminum, titanium, tantalum, tungsten, molybdenum. Refractory metals and their silicides are compatible with CMOS semiconductor processing and have relatively good mechanical properties. These materials can be deposited by PVD, CVD, or PECVD. Their optical reflectivity may be enhanced by further depositing a layer of metallic thin-films, such as aluminum, gold, or their alloys depending on the applications of the mirror plate 102.

Figure 2:
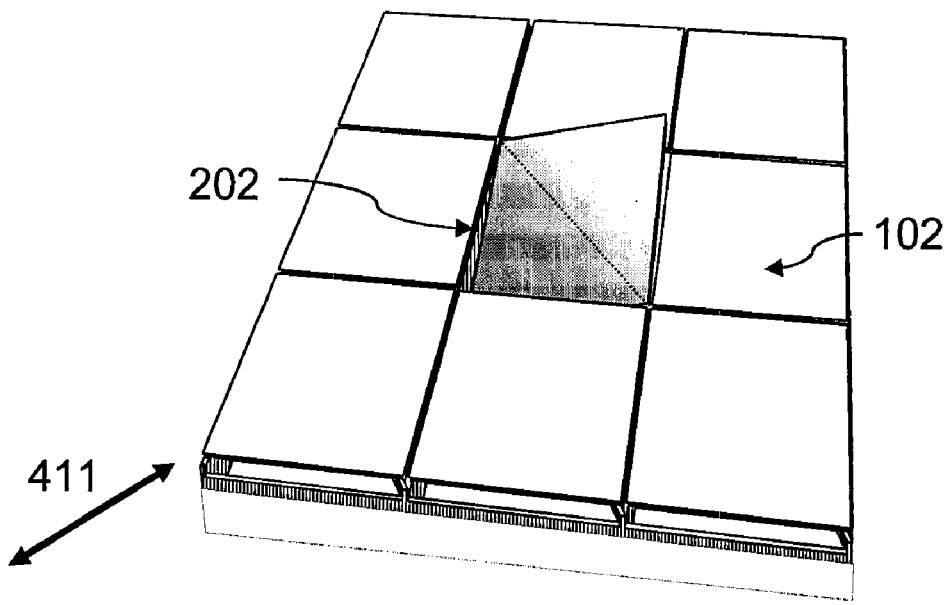
FIG. 2 is a perspective view of an array of rectangular shaped mirror plates.

To achieve a high contrast ratio in video images, any scattered light from a micro mirror array should be reduced or eliminated. Most interference comes from the diffraction patterns generated by the scattering of illumination from the leading and trailing edges of individual mirror plates. The solution to the diffraction problem is to reduce the intensity of diffraction pattern and to direct the scattered light from the inactive area of each pixel in different directions away from the projection pupil. One method includes directing the incident light 411 45° to the edges of the square-shaped mirror plate 102, which is sometimes called diagonal hinge or diagonal illumination configuration. FIG. 2 shows a perspective view showing the top of a part of the mirror array with each mirror plate 102 having a square shape using a diagonal illumination system. The hinges 106 of the mirror plate in the array are fabricated in a diagonal direction along two opposite corners of the mirror plate and perpendicular to the incident light 411. The advantage of a square mirror plate with a diagonal hinge axis is its ability to deflect the scattered light from the leading and trailing edges 45° away from the projection pupil 403. The disadvantage is that it requires the projection prism assembly system to be tilted to the edge of the SLM. The diagonal illumination has a low optical coupling efficiency when a conventional rectangular total internal reflection (TIR) prism system is used to separate the light beams that are reflected by the mirror plate 102 in the "on" state and the "off" state. The twisted focusing spot requires an illumination larger than the size of rectangular micro mirror array surfaces in order to cover all active pixel arrays. A larger rectangular TIR prism can increase the cost, size, and the weight of the projection display.

Figure 3:
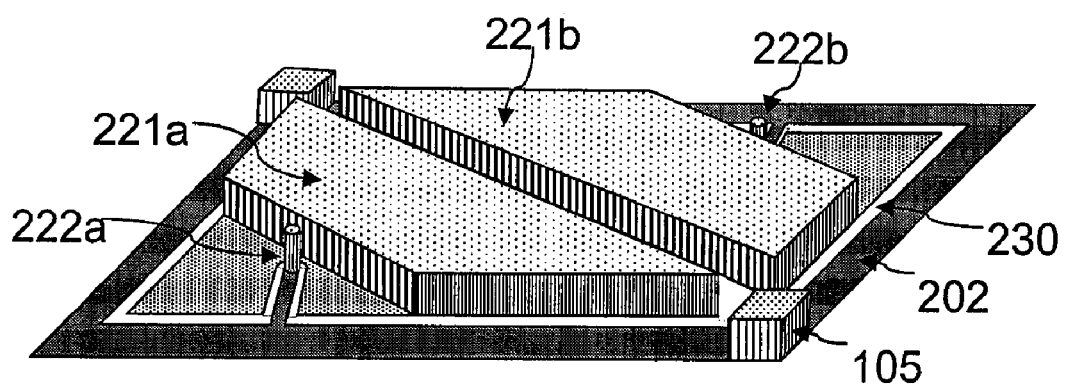
FIG. 3 is a perspective view showing the top of a part of the control circuitry substrate for a mirror plate of FIG. 2.

FIG. 3 shows a perspective view of the top of a part of the control circuitry substrate for the projection system with a diagonal illumination configuration. The pair of step electrodes 221a and 221b is arranged diagonally to improve the electrostatic efficiency of the capacitive coupling to the mirror plate 102. The two landing tips 211a and 211b act as the landing stops for a mechanical landing of mirror plates 102 to ensure the precision of tilted angle θ and to overcome the contact stiction. Made of high spring constant materials, these landing tips 222a and 222b act as landing springs to reduce the contact area when mirror plates are snapped down. A second function of the landing tips 222 at the edge of two-level step electrodes 221a and 221b is their spring effect to separate themselves from the mirror plates 102. When an abrupt bipolar pulse voltage potential Vb is applied to the mirror plate 102 through a common bias electrode 303 of the mirror array, a sharp increase of electrostatic forces F on the whole mirror plate 102 provides a dynamic excitation by converting the electromechanical kinetic energy into an elastic strain energy stored in the deformed hinges 106. The elastic strain energy is converted back to the kinetic energy of mirror plate 102 as it springs and bounces away from the landing tip 222a or 222b.

The straight edges or corners of the mirror plates in a periodic array can create diffraction patterns that tend to reduce the contrast of projected images by scattering the incident light 411 at a fixed angle. Curved leading and trailing edges of the mirror plate in the array can reduce the diffraction patterns due to the variation of scattering angles of the incident light 411 on the edges of the mirror plate. According to some embodiments, the reduction of the diffraction intensity into the projection pupil 403 while still maintaining an orthogonal illumination optics system is achieved by replacing the straight or fixed angular shaped edges of a rectangular mirror plate with at least one or a series of curved leading and trailing edges with opposite recesses and extensions. Curved leading and trailing edges perpendicular to the incident light 411 can reduce the diffracted light in the projection system.

Figure 4:
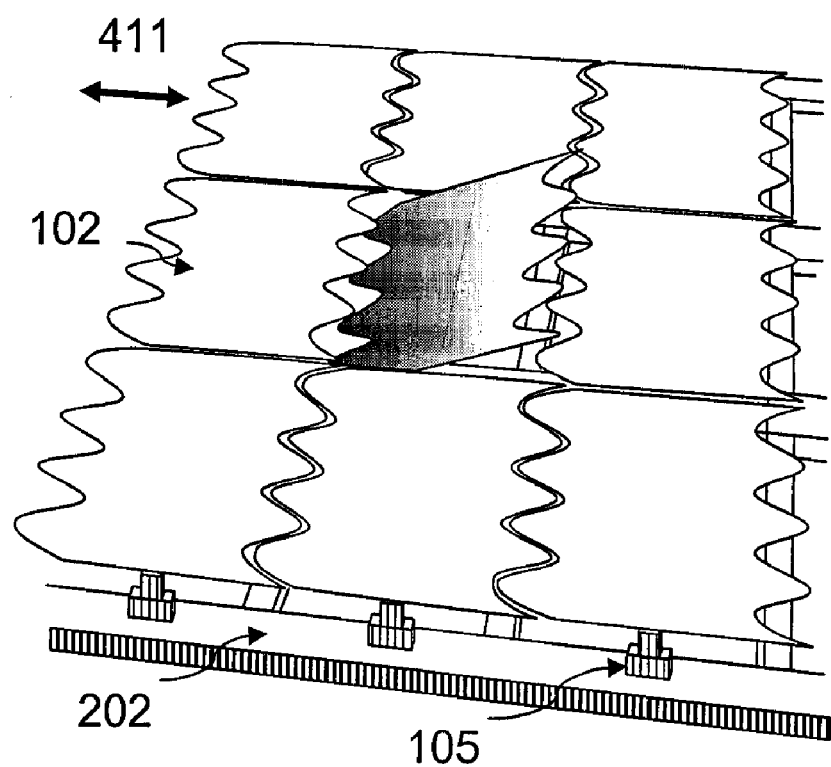
FIG. 4 is a perspective view showing an array of mirror plate having curved edges.

Orthogonal illumination has a higher optical system coupling efficiency, and can enable a less expensive, smaller size, and lighter TIR prism. However, since the scattered light from both the leading and trailing edges of the mirror plate is scattered straight into the projection pupil 403, it creates a diffraction pattern, reducing the contrast ratio of a SLM. FIG. 4 shows a perspective view of the top of a part of mirror array with rectangular mirrors for the projection system with orthogonal illumination configuration. The hinges 106 are parallel to the leading and trailing edges of the mirror plate and perpendicular to the incident light 411, that is, the mirror pixels in the SLM are illuminated orthogonally. In FIG. 4, each mirror plate in the array has a series of curvatures in the leading edge extension and trailing edge recession. A curved edge weakens the diffraction intensity of scattered light and it further diffracts a large portion of scattered light in a variety of angles away from the optical projection pupil 403. The radius of curvature of the leading and trailing edges of each mirror plate r may vary depending on the number of curvatures selected. As the radius of curvature r becomes smaller, the diffraction reduction effect becomes more prominent. To maximize the diffraction reduction effects, according to some embodiments, a series of small radius curvatures r are designed to form the leading and trailing edges of each mirror plate in the array. The number of curvatures may vary depending on the size of the mirror pixels. A 10 microns size square mirror pixel can have two to four curvatures on each leading and trailing edges and can provide an optimum result with respect to low diffraction.

Figure 5:
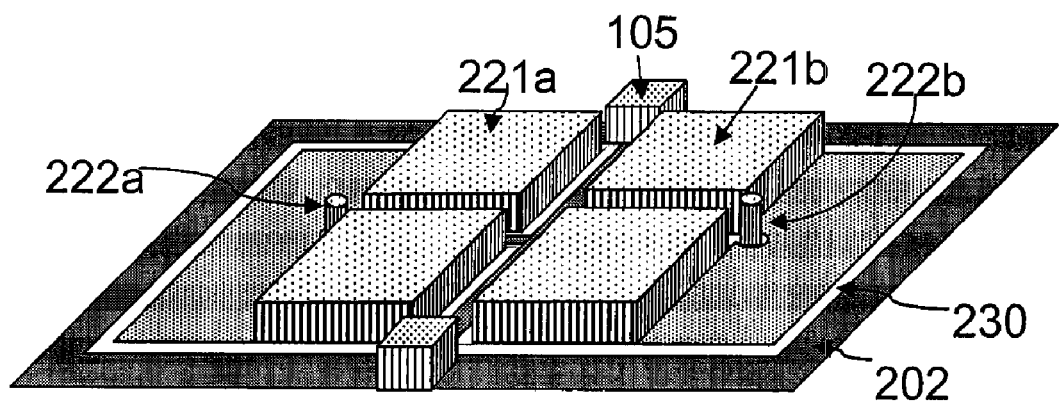
FIG. 5 is a perspective view showing the top of a part of the control circuitry substrate for a mirror plate in FIG. 4.

FIG. 5 is a perspective view showing the top of a part of the control substrate 300 for a projection system with orthogonal illumination configurations. Unlike conventional flat electrodes, the two-level step electrodes 221a and 221b raised above the surface of the control substrate 300 near the hinge axis narrows the effective air gap spacing between the flat mirror plate 102 and the electrodes 221a and 221b. The lower step of the step electrodes 221a and 221b significantly enhances the electrostatic efficiency of capacitive coupling of mirror plate 102. The number of levels for the step electrodes 221a and 221b can vary, such as from one to ten. However, the larger the number of levels for step electrodes 221a and 221b, the more complicated and costly it can be to manufacture the device. Therefore the step electrodes 221a and 221b can be made with two to three steps. FIG. 5 also shows the mechanical landing stops including landing tips 222a and 222b oriented perpendicular to the surface of control substrate 300. These landing tips 222a and 222b provide a mechanical stop during the landing operation of angular cross over transitions. The landing tips 222a and 222b at the edge of step electrodes 221a and 221b act as landing tips to further overcome the contact surface adhesion. This low voltage driven and high efficiency micro mirror array design allows an operation of a larger total deflection angle ($|\theta|>15°$) of micro mirrors to enhance the brightness and contrast ratio of the SLM.

Figure 6:
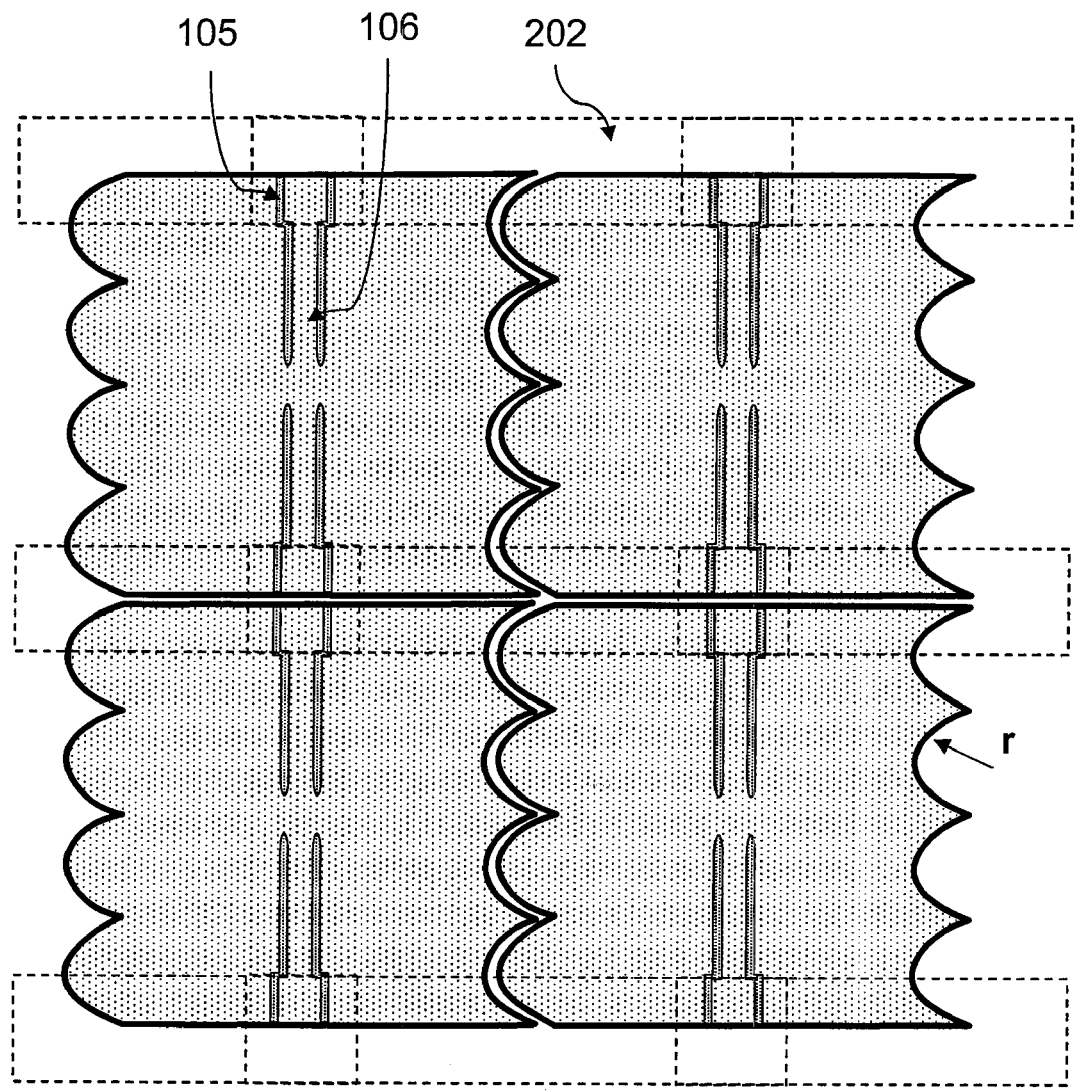
FIG. 6 is an enlarged backside view of the mirror plates having curved leading and trailing edges.

An advantage of the spatial light modulator described herein is that it produces a high reflection area fill-ratio by positioning the hinge 106 under the cavities in the lower portion of mirror plate 102, which almost completely eliminates the horizontal displacement of mirror plate 102 during tilting. FIG. 6 shows an enlarged backside view of a part of the mirror array designed to reduce diffraction intensity using four-curvature leading and trailing edges for a projection system with an orthogonal illumination configuration. Again, pairs of hinges 106 are positioned under two cavities as part of the mirror lower portion 103c. The hinges 106 are supported by a pair of hinge support posts 105 on top of hinge support frames 202. A pair of hinge support posts 105 has a width W in the cross section much larger than the width of the hinge 106. Since the distance between the axis of the pair of hinges 106 and the reflective surfaces of the mirror plate is kept to a minimum, a high reflection area fill-ratio is achieved by closely arranging individual mirror pixels without concerns about the horizontal displacement. In an example, the mirror pixel size (a×b) is about 10 microns×10 microns, while the radius of curvature r is about 2.5 microns.

Figure 7:
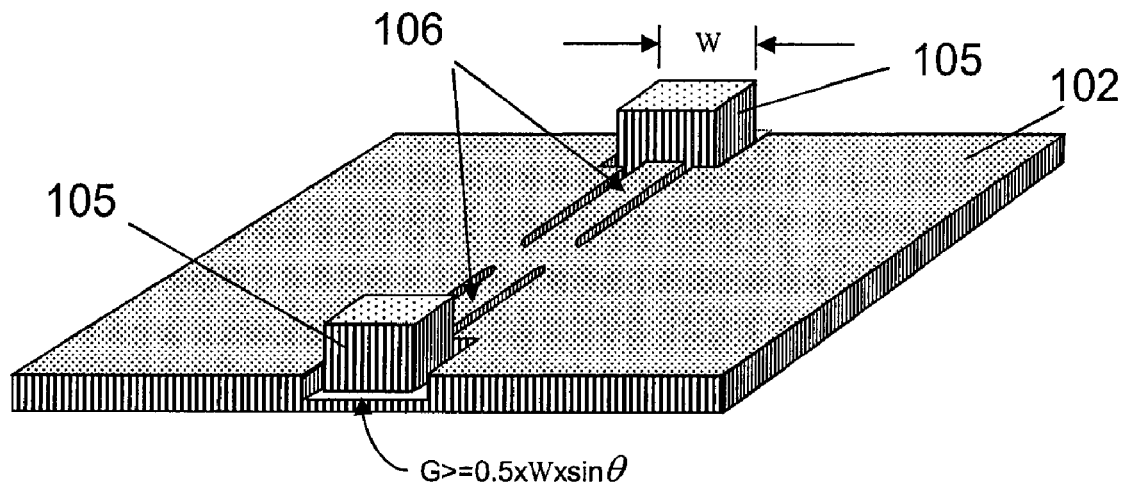
FIG. 7 is a perspective bottom view showing the torsion hinges and their support posts under the cavities in the lower portion of a mirror plate.

FIG. 7 shows an enlarged backside view of a part of the mirror plate. The hinges 106 and the hinge support posts 105 are under the cavities in the lower portion of a mirror plate 102. To achieve optimum performance, a minimum air gap G can be maintained in the cavity where the hinges 106 are located. The dimension of the hinges 106 varies depending on the size of the mirror plates 102. In one implementation, the dimension of each hinge 106 is about 0.1×0.2×3.5 microns, while the hinge support post 105 has a square cross-section with each side W about 1.0 micron width. Since the top surfaces of the hinge support posts 105 are also under the cavities, the air gap G in the cavity needs to be high enough to accommodate the angular rotation of mirror plate 102 without touching the larger hinge support posts 105 at a predetermined angle θ. In order for the mirror plate to rotate a predetermined angle θ without touching the hinge support post 105, the air gap of the cavities where hinges 106 are positioned must be larger than $G=0.5 \times W \times SIN(\theta)$, where W is the cross-sectional width of the hinge support posts 105.

Figure 8:
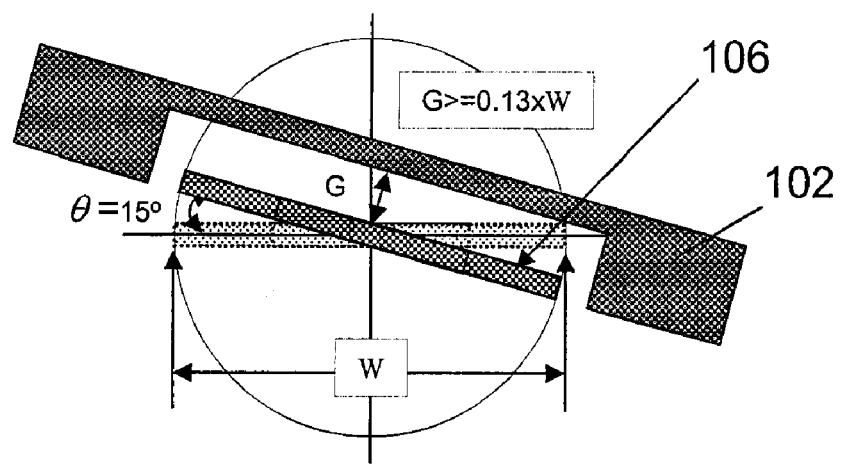
FIG. 8 is a diagram illustrates a minimum air gap spacing around the torsion hinge of a mirror plate when rotated 15° in one direction.

FIG. 8 illustrates a minimum air gap spacing G around the hinge 106 of a mirror plate 102 when the plate 102 is rotated 15° in one direction. The calculation indicates that the air gap spacing G of hinge 106 in the cavity must be larger than $G=0.13 W$. If a width of each side W of a square hinge support post 105 is 1.0 micron, the air gap spacing G in the cavity should be larger than 0.13 microns. Without horizontal displacement during the tilting, the horizontal gap between the individual mirror plates in the micro mirror array may be reduced to less than 0.2 microns, which leads to a 96% active reflection area fill-ratio of the SLM described herein.

In one implementation, fabrication of a high contrast spatial light modulator is implemented as four sequential processes using standard CMOS technology. A first process forms a control silicon wafer substrate with support frames and arrays of first level electrodes on the substrate surface. The first level electrodes are connected to memory cells in addressing circuitry in the wafer. A second process forms a plurality of second level electrodes, landing tips, and hinge support posts on the surfaces of control substrate. A third process forms a plurality of mirror plates with hidden hinges on each pairs of support posts. In a fourth process, the fabricated wafer is separated into individual spatial light modulation device dies. In forming the device, sacrificial layers are used during the fabrication process. The separation can be done before removing the remaining sacrificial materials.

Figure 9:
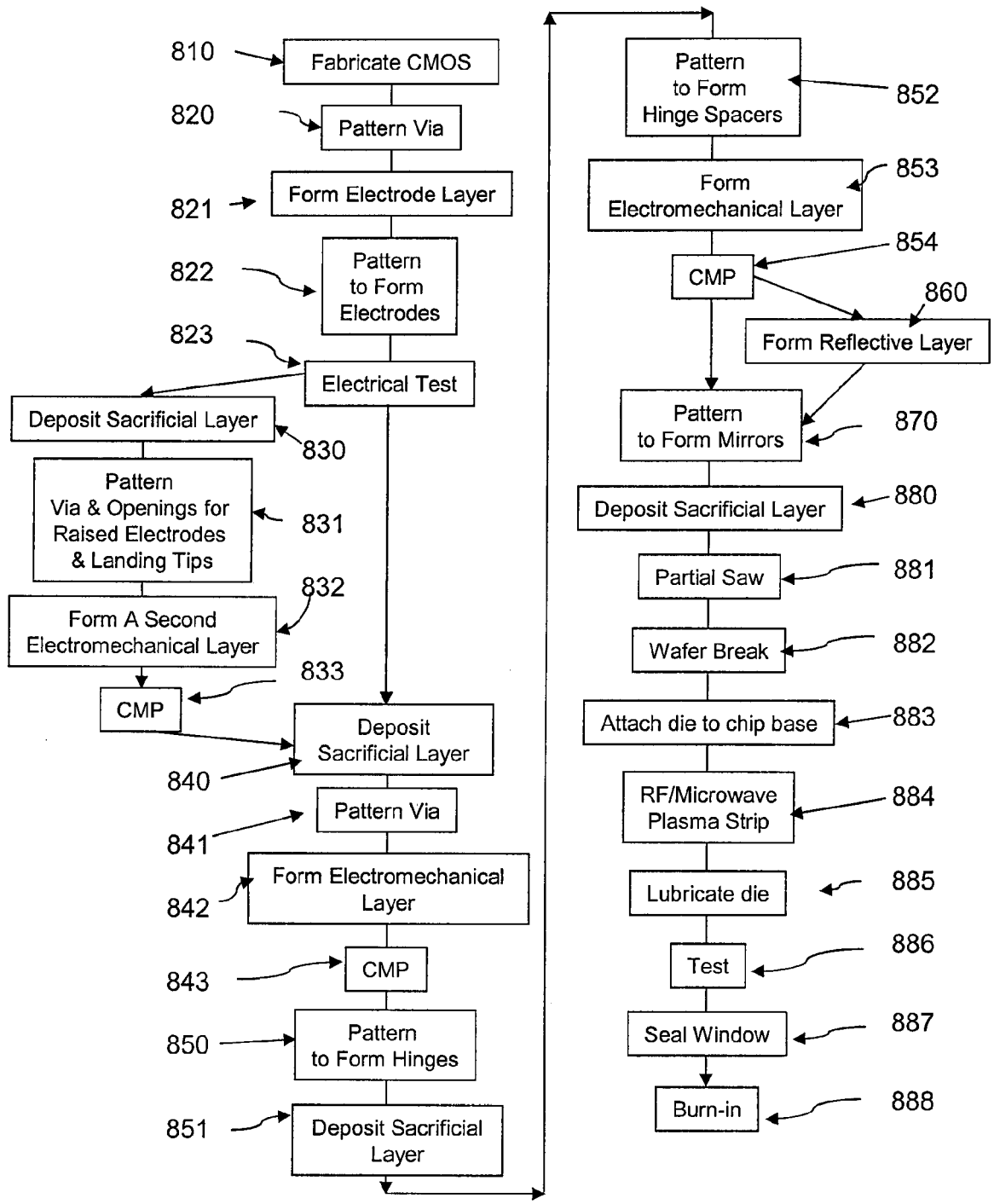
FIG. 9 is a manufacturing process flow diagram for a micro-mirror based spatial light modulator.

FIG. 9 is a flow diagram illustrating a process for making a high contrast spatial light modulator. The manufacturing processes starts by fabricating a CMOS circuitry wafer having a plurality of memory cells and word-line/bit-line interconnection structures for communicating signals as the control substrate using common semiconductor technology (step 810).

Figure 10:
FIG. 10-13 are cross-sectional side views of a part of a spatial light modulator illustrating one method for fabricating a plurality of support frames and the first level electrodes connected to the memory cells in the addressing circuitry.
Figure 11:
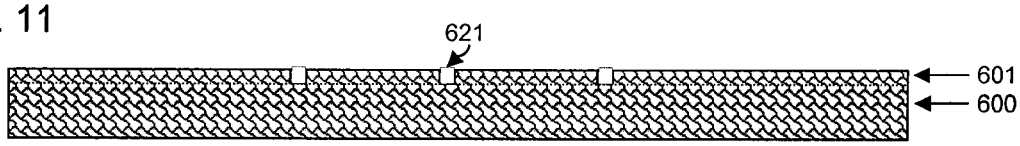

A plurality of first level electrodes and support frames are formed by patterning a plurality of vias through the passivation layer of the circuitry opening up the addressing nodes in the control substrate (step 820). To enhance the adhesion of a subsequent electromechanical layer, the via and contact openings are exposed to a 2000 watts of RF or microwave plasma with 2 torr total pressures of a mixture of $O_2$, $CF_4$, and $H_2O$ gases at a ratio of about 40:1:5 at about 250° C. for less than five minutes. The electromechanical layer can be deposited by physical vapor deposition (PVD) or plasma-enhanced chemical vapor deposition (PECVD), depending on the materials selected for filling the vias and forming an electrode layer on the surface of the control substrate (step 821). Depositing the electromechanical layer and the subsequent forming of the vias is illustrated in FIGS. 10 and 11, and discussed below with respect to FIGS. 10 and 11.

Figure 12:
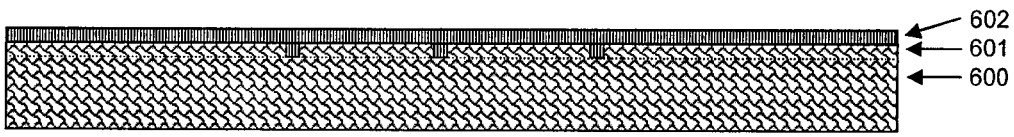
Figure 13:
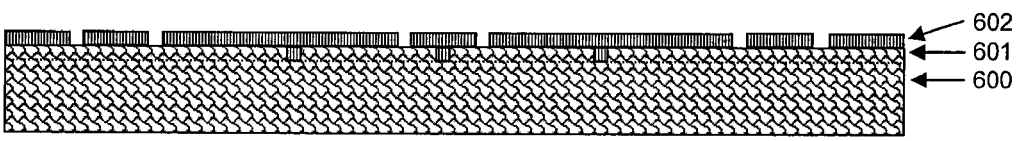

Then the electromechanical layer is patterned and anisotropically etched through to form a plurality of electrodes and support frames (step 822). The partially fabricated wafer is tested to ensure electrical functionality before proceeding to further processes (step 823). The formation of electrodes and support frames are illustrated in FIGS. 12 and 13 and described in detail below in the related discussions.

According to some embodiments, the electromechanical layer deposited and patterned in steps 821 and 822 can include a metal such as aluminum, titanium, tantalum, tungsten, molybdenum film, an aluminum/poly-silicon composite, an aluminum-copper alloy, or an alluminum-silicon alloy. While each of these metals has slightly different etching characteristics, they all can be etched in similar chemistry to plasma etching of aluminum. In the present specification, a two step processes is carried out to anisotropically etch aluminum metallization layers. First, the wafer is etched in inductively coupled plasma while flowing $BCl_3$, $Cl_2$, and Ar mixtures at flow rates of about 100 sccm, 20 sccm, and 20 sccm respectively. The unit "sccm" stands for "standard cubic centimeters per minute", wherein the term "standard" refers to the conditions of 0 degrees Celsius and 760 Torr. The operating pressure is in the range of 10 to 50 mTorr, the inductively coupled plasma bias power is 300 watts, and the source power is 1000 watts. During the etching process, the wafer is cooled with a backside helium gas flow of 20 sccm at a pressure of 1 Torr. Since the aluminum pattern can not simply be removed from the etching chamber into the ambient atmosphere, a second oxygen plasma treatment step is performed to clean and passivate the aluminum surfaces. In a passivation process, the surfaces of a partially fabricated wafer are exposed to a 2000 watts of RF or microwave plasma with 2 torr pressures of a 3000 sccm of $H_2O$ vapor at about 250° C. temperatures for less than three minutes.

In some embodiments, the electromechanical layer can include a polysilicon, a polycides, a silicide, or a combination of the these materials. While each of these materials has slightly different etching characteristics, they all can be etched in similar chemistry to plasma etching of polysilicon. Anisotropic etching of polysilicon can be accomplished with most chlorine and fluorine based feedstock, such as $Cl_2$, $BCl_3$, $CF_4$, $NF_3$, $SF_6$, HBr, and their mixtures with Ar, $N_2$, $O_2$, or $H_2$. The polysilicon or silicide layer ($WSi_x$, or $TiSi_x$, or TaSi) is etched anisotropically in inductively decoupled plasma while flowing $Cl_2$, $BCl_3$, HBr, and $HeO_2$ gases at flow rates of about 100 sccm, 50 sccm, 20 sccm, and 10 sccm respectively. In another embodiment, the polycide layer is etched anisotropically in a reactive ion etch chamber while flowing $Cl_2$, $SF_6$, HBr, and $HeO_2$ gases at a flow rate of about 50 sccm, 40 sccm, 40 sccm, and 10 sccm, respectively. In both cases, the operating pressure is in the range of about 10 to 30 mtorr, the inductively coupled plasma bias power is about 100 watts, and the source power is about 1200 watts. During the etching process, the wafer is cooled with a backside helium gas flow of about 20 sccm at a pressure of 1 Torr. A typical etch rate can reach about 9000 angstroms per minute.

A plurality of second level electrodes can be fabricated on the surface of the control substrate to reduce the distance between the mirror plate and the electrode on the substrate, which improves the electrostatic efficiency. Landing tips can also be fabricated on the substrate to reduce stiction between the mirror plate and the substrate.

A layer of sacrificial material is deposited with a predetermined thickness on the surface of the partially fabricated wafer (step 830). In accordance with the present specification, the sacrificial material can be a low K material, such as amorphous carbon, polyarylene, polyarylene ether, SiLK™, available from The Dow Chemical Company, hydrogen silsesquioxane (HSQ), PTFE, polyimides, or a photo resist material. Amorphous carbon can be deposited by CVD or PECVD. The polyarylene, polyarylene ether, hydrogen silsesquioxane, and the photo resist material can be spin-coated on the surface. The sacrificial layer will first be hardened before the subsequent build up. The deposited amorphous carbon can harden by thermal annealing after the deposition by CVD or PECVD. Polyarylene and polyarylene ether, SiLK™, HSQ, and photo resist can be hardened by UV exposure and optionally, by thermal and plasma treatments.

The sacrificial layer is next patterned to form via and contact openings for a plurality of second level electrodes, landing tips, and support posts (step 831). A second electromechanical layer is then deposited by PVD or PECVD depending on the materials selected, forming a plurality of second level electrodes, landing tips, and support posts (step 832). Finally, the second electromechanical layer is planarized to a predetermined thickness by chemical mechanical polishing (CMP) (step 833). The height of second level electrodes and landing tips can be less than one micron. Step 830 through step 833 can be repeated to build a number of steps in the step electrodes. The number of repeated processing steps 830-833 is determined by the number of steps in the step electrodes. The processing steps 830-833 can be bypassed (i.e., from step 823 directly to step 840) if a flat electrode is fabricated on the control substrate.

Once the raised multi-level step electrodes and landing tips are formed on the CMOS control circuitry substrate, a plurality of mirror plates are fabricated. Each mirror plate has a hidden hinge and is supported by a pair of support posts. Sacrificial materials are deposited with a predetermined thickness on the surface of the partially fabricated wafer (step 840). The sacrificial layer is patterned to form vias for a plurality of hinge support posts (step 841). The sacrificial layer is hardened before deposition of electromechanical materials, such as by PVD or PECVD depending on the materials selected to fill the vias. A thin layer of electromechanical materials is applied to form torsion hinges and part of the mirror plates (step 842). The electromechanical layer is planarized to a predetermined thickness, such as by CMP (step 843). The electromechanical layer is patterned with a plurality of openings to form a plurality of torsion hinges (step 850). To form a plurality of cavities in the lower portion of mirror plate and torsion hinges positioned under the cavities, sacrificial materials can again be deposited to fill the opening gaps around the torsion hinges and to form a thin layer with a predetermined thickness on top of hinges (step 851). The thickness can be slightly larger than $G=0.5 \times W \times SIN(\theta)$, where W is the cross-section width of hinge support posts 105. The sacrificial layer is patterned to form a plurality of spacers on top of each torsion hinge (step 852). More electromechanical materials are deposited to cover the surface of the partially fabricated wafer (step 853).

The sacrificial materials in steps 840-851 can also be selected from the above disclosed materials, amorphous carbon, polyarylene and polyarylene ether, SiLK™, HSQ, and a photo resist material. Amorphous carbon can be deposited by CVD or PECVD. Polyarylene, polyarylene ether, HSQ, SiLK™, and photo resist can be spin-coated on the surface. Moreover, different sacrificial materials may be implemented at different steps of the fabrication process.

The electromechanical layer is planarized to a predetermined thickness by CMP (step 854) before a plurality of openings are patterned. The sacrificial materials are removed through the openings to form a plurality of air gaps between individual mirror plates (step 870).

The reflectivity of mirror surface may be enhanced by depositing a reflective layer on the mirror surface (step 860). The layer can be deposited by PVD and the layer can be a 400 angstroms or less thick reflective layer selected from aluminum, gold, and combinations thereof.

Several of sacrificial materials (amorphous carbon, SiLK™, and HSQ) can be easily removed using dry processes, such as isotropic plasma etching, microwave plasma, activated gas vapor or other suitable dry process. The sacrificial material can be removed from below other layers of materials. The removal can also be highly selective relative to common semiconductor components. For example, amorphous carbon can be removed at a selectivity ratio of 8:1 relative to silicon and 15:1 relative to silicon oxide. Thus, the disclosed sacrificial materials can be removed with minimal damage to the intended micro structures.

Amorphous carbon, SiLK™, and HSQ can be removed by isotropic etching in dry processes. The dry removal process eliminates the need for wet chemicals in wet processes for cleaning the conventional sacrificial materials. Isotropic etching allows removal of sacrificial materials that are positioned under an upper structural layer such as a mirror plate, which cannot easily be accomplished by dry anisotropic etching processes. If amorphous carbon is the sacrificial material, the amorphous carbon can be deposited and removed by conventional CMOS processes. Amorphous carbon can also maintain high carbon purity and does not usually contaminate most micro devices.

To separate the fabricated wafer into individual spatial light modulation device dies, a thick layer of sacrificial materials is deposited to cover the fabricated wafer surfaces to protect the surfaces (step 880). Then the fabricated wafer is partially sawed (step 881) before being separated into individual dies, such as by scribing and breaking (step 882). The spatial light modulator device die is attached to the chip base with wire bonds and interconnects (step 883) before striping the remaining sacrificial materials from the dies, such as by RF or microwave plasma treatment (step 884). The SLM device die is lubricated, such as by exposing the die to a PECVD coating of anti-stiction material in the interfaces between the mirror plate and the surfaces of the electrodes and landing tips (step 885). An electro-optical functional test is performed on the dies (step 886). Finally, the SLM device is hermetically sealed, such as with a glass window lid (step 887) and a burn-in process is performed for reliability and robust quality control (step 888).

One potential problem with the operation of a micro mirror array is the stiction of a micro mirror when in a landing position. The surface contact adhesion between the micro mirror and the landing tip can be greater than the electrostatic force applied by the control circuitry. This can cause the device to fail because of stiction, particularly in a humid environment. To reduce the contact adhesion between the mirror plate 102 and landing tips 222a and 222b, and protect the mechanical wear degradation of interfaces during the touch and impact of during tilting, a thin coating of lubricant is deposited as an anti-stiction material on the lower portion of mirror plate 102 and on the surfaces of step electrodes 221a and 221b and landing tips 222a and 222b. The lubricants chosen should be thermally stable, have low vapor pressure, and be non-reactive with the materials that form the micro mirror array devices.

A layer of fluorocarbon material can also be coated on the surfaces of the lower portion of mirror plate and on the surface of the electrodes and landing tips. The layer thickness of the fluorocarbon material can be as thin as a few monolayer thick. To form the fluorocarbon coating, the SLM device die is exposed to a fluorocarbon plasma, such as $CF_4$, at a substrate temperature of about 200° C. temperatures for less than five minutes. This process deposits a layer of fluorocarbon on the surfaces 103c serves to prevent adherence or attachment of water to the interfaces of mirror plate and the electrodes and landing tips, which eliminates the impact of humidity in the stiction of mirror plate during landing operation. Coating fluorocarbon film on the portions of the mirror plate 102, step electrodes 221a and 221b and landing tips 222a and 222b that contact one another during device operation provides a sufficient repellent for water due to the presence of fluorine atoms on the exposed surfaces.

In some embodiments, a perfluoropolyether (PFPE) or a mixture of PFPE and a phosphazine derivative is deposited by PECVD on the contact surfaces of the device. To improve the adhesion and lubricating performance on surfaces of the device, phosphate esters may be chosen because of their affinity with metallic surfaces. The PFPE and phosphazine derivatives can be deposited onto the device at a temperature of about 200° C. for less than five minutes. PFPE molecules have an aggregate vapor pressure in the range of $1 \times 10^{-6}$ to $1 \times 1^{-11}$ atm. The thickness of the layer of anti-stiction material film less than 1000 angstroms is usually sufficient for it to perform the desired anti-stiction function during device operations.

A more detailed description of each process to fabricate a high contrast spatial light modulator is illustrated in a series of cross-sectional diagrams. FIG. 10 is a cross-sectional view that illustrates the control silicon substrate 600. In the following figures, the fabrication of only one micro mirror device is shown, for the sake of simplicity. However, an array of micro mirror devices can be fabricated in a single substrate at one time. In one embodiment, the control circuitry in the control substrate includes an array of memory cells and word-line/bit-line interconnects for communication signals. There are many different methods of making electrical circuitry that performs the addressing function. The DRAM, SRAM, and latch devices commonly known may all perform the addressing function. Since the mirror plate 102 area may be relatively large on semiconductor scales (for example, the mirror plate 102 may have an area of larger then 100 square microns), complex circuitry can be manufactured beneath micro mirror 102. Possible circuitry includes, but is not limited to, storage buffers to store time sequential pixel information and circuitry to perform pulse width modulation conversions.

The control silicon substrate is covered with a passivation layer 601, such as silicon oxide or silicon nitride. The passivated control substrate 600 is patterned and etched anisotropically to form vias 621 connected to the word-line/bit-line interconnects in the addressing circuitry, as shown in FIG. 11. According to some embodiments, anisotropic etching of dielectric materials, such silicon oxides or silicon nitrides, is accomplished with $C_2F_6$ and $CHF_3$ based feedstock and their mixtures with He and $O_2$. An exemplified high selectivity dielectric etching process includes the flow of $C_2F_6$, $CHF_3$, He, and $O_2$ gases at a ratio of 10:10:5:2 mixtures at a total pressure of 100 mTorr with an inductive source power of 1200 watts and a bias power of 600 watts. The substrate is then cooled with a backside helium gas flow of 20 sccm at a pressure of 2 torr. A typical silicon oxide etch rate can reach 8000 angstroms per minute.

FIG. 12 shows that an electromechanical layer 602 is deposited by PVD or PECVD depending on the electromechanical materials selected. Referring to FIG. 13, the electromechanical layer 602 is patterned to define hinge support frames 202 and the first steps of the step electrodes 221a and 221b. The patterning can be performed by the following processes. First, a layer of sacrificial material is spin coated to cover the substrate surface. Then the sacrificial layer is exposed and developed to form predetermined patterns. The electromechanical layer is anisotropically etched through to form a plurality of vias and openings. Once the vias and openings are formed, the partially fabricated wafer is cleaned by removing the residues from the surfaces and inside the openings. This is accomplished by exposing the patterned wafer to 2000 watts of RF or microwave plasma with 2 torr total pressures of a mixture of $O_2$, $CF_4$, and $H_2O$ gases at a ratio of 40:1:5 at about 250° C. for less than five minutes. Finally, the surfaces of electromechanical layer are passivated by exposing the surfaces to about 2000 watts of RF or microwave plasma at about 2 torr of about 3000 sccm of $H_2O$ vapor at about 250° C. for less than three minutes.

Figure 14:
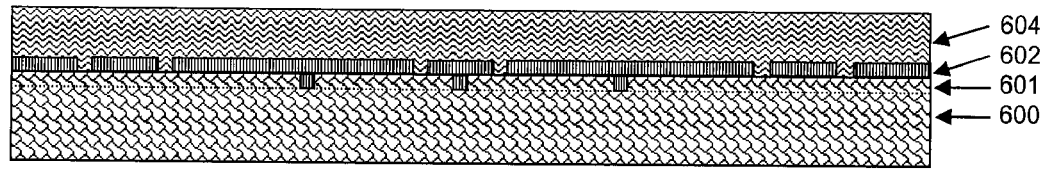
FIG. 14-17 are cross-sectional side views of a part of a spatial light modulator illustrating one method for fabricating a plurality of support posts, second level electrodes, and landing tips on the surface of control substrate.

Second steps of the step electrodes 221a and 221b, landing tips 222a and 222b, and hinge support post 105 are formed on the surface of partially fabricated wafer. A micron thick sacrificial material 604 is deposited or spin-coated on the substrate surface, as shown in FIG. 14. If the sacrificial layer 604 is formed of amorphous carbon, it can harden by thermal annealing after CVD or PECVD. If the sacrificial layer 604 is formed of HSQ or SiLK™, the layer can be hardened by UV exposure and optionally thermal and plasma treatments.

Figure 15:
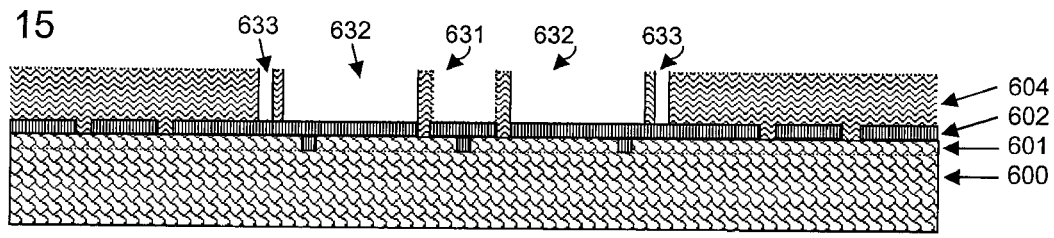
Figure 16:
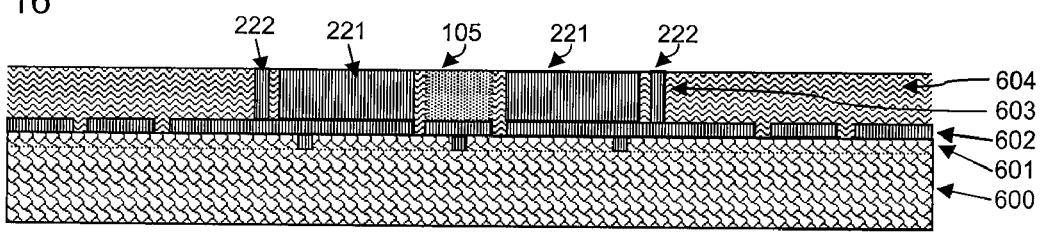

The sacrificial layer 604 is patterned to form a vias 633 and contact openings 631 and 632 as shown in FIG. 15. The openings 632 will later be filled to from the step electrodes 221. The vias 633 are for the formation of the landing tips 222. The contact opening 631 is for the formation of the hinge support posts 105. To enhance the adhesion of a subsequent electromechanical layer, the vias and contact openings are exposed to about 2000 watts of RF or microwave plasma with 2 torr total pressures of a mixture of $O_2$, $CF_4$, and $H_2O$ gases at a ratio of 40:1:5 at about 250° C. for less than five minutes. An electromechanical material 603 is then deposited to fill the vias and contact openings. The filling is done by either PECVD or PVD depending on the materials selected. For the materials selected from the group consisting of aluminum, titanium, tungsten, molybdenum, and their alloys, PVD is a common deposition method in the semiconductor industry. For the materials selected from the group consisting of silicon, polysilicon, silicide, polycide, tungsten, and their combinations, PECVD is chosen as a method of deposition. The partially fabricated wafer is planarized by CMP to a predetermined thickness slightly less than one micron shown, as shown in FIG. 16. In some embodiments, the vias 633 and contact openings 631 and 632 can be filled by depositing amorphous silicon into these areas using PECVD.

The deposition of amorphous silicon using PECVD is conducted in a processing chamber at a temperature below 550° C., for example, in the range of 100° C. to 450° C. The pressure of the processing chamber can be kept in a range from 1 to 10 Torr. A $SiH_4$ gas can be blown through the chamber at a rate in the range of about 20-300 sccm. A $PH_3$ gas can be blown through the chamber at a rate a rate in the range of about 20-500 sccm, A Helium gas can be blown through the chamber at a rate in the range of about 2000-10000 sccm. An RF field at a power of 50-1200 Watts can be applied during deposition. Table I lists an example of the process conditions for PECVD of the amorphous silicon.

TABLE I

Processing conditions for depositing amorphous silicon using PECVD

| Parameters | Value |
| --- | --- |
| Flow rate of $SiH_4$ gas | 50 sccm |

TABLE I-continued

Processing conditions for depositing
amorphous silicon using PECVD

| Parameters | Value |
| --- | --- |
| Flow rate of PH$_3$ gas | 200 sccm |
| Flow rate of He gas | 2000 sccm |
| Pressure of the processing chamber | 5 Torr |
| RF Power | 100 Watt |
| Temperature | 350° C. |

Figure 27:
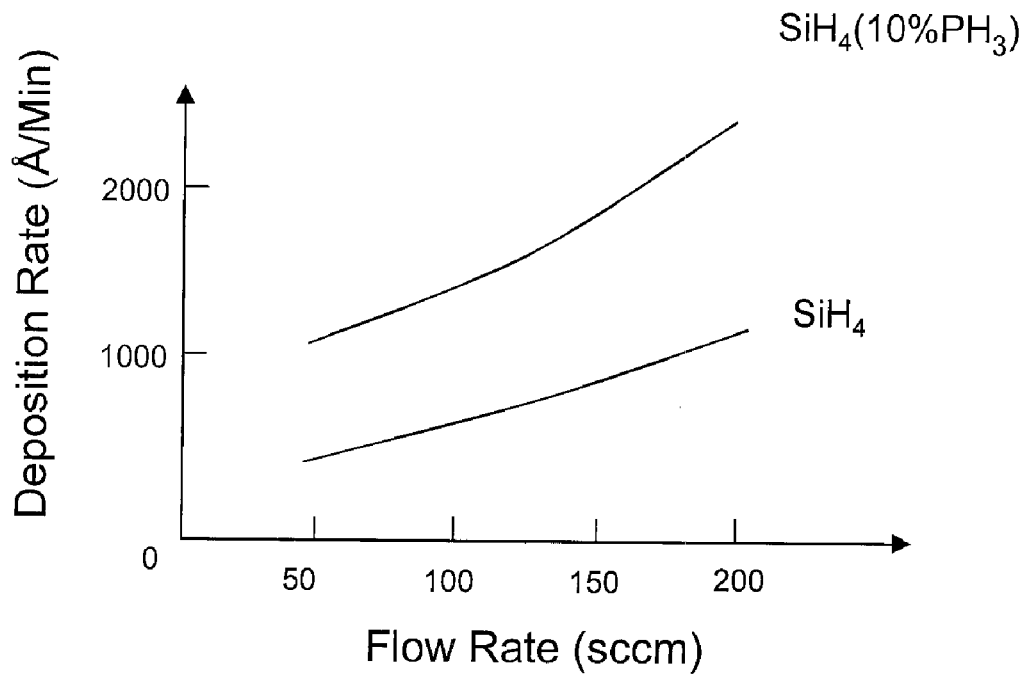
FIG. 27 is a plot illustrating the deposition rate of amorphous silicon as a function of the flow rate for a $SiH_4$ gas and a $SiH_4/PH_3$ gas in a PECVD process.

Exemplified PECVD deposition rates of the amorphous silicon are shown in FIG. 27 as a function of the flow rate for a SiH$_4$ gas and a SiH$_4$(90%)/PH$_3$(10%) gas. The deposition rates can be in the range from 0.1 to over 100 Å/Min. The deposition rates can be several times more than a magnitude higher for the SiH$_4$ gas than that of the SiH$_4$(90%)/PH$_3$(10%) gas.

The exemplified temperature range can ensure that the CMOS circuit in the substrate 600 won't suffer heat-related damages. Furthermore, as discussed below, the step electrodes 221, the landing tips 222, and the hinge support posts 105 formed from the amorphous silicon have the electrical, optical and mechanical properties that meet the performance requirements of the tiltable micro mirrors in the SLM 400.

Figure 17:
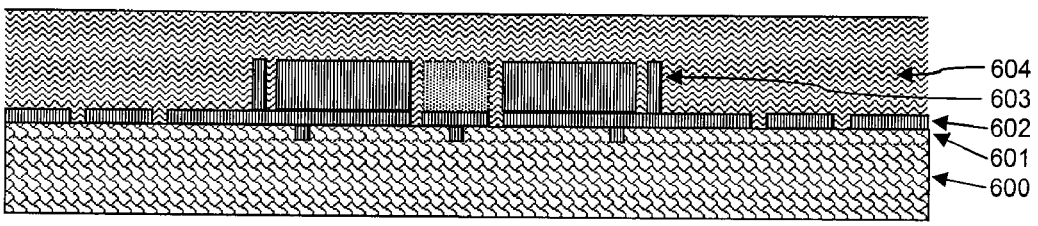
Figure 18:
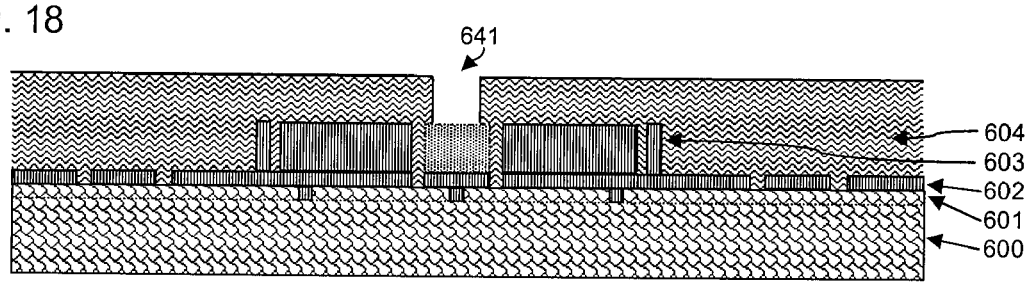
FIG. 18-20 are cross-sectional side views of a part of a spatial light modulator illustrating one method for fabricating a plurality of torsion hinges and its supports on the support frame.

As shown in FIG. 17, after CMP planarization another layer of sacrificial materials 604 is deposited (in the case of amorphous carbon) or spin-coated (in the case of HSQ, SiLK™, or photo resist) on the blanket surface to a predetermined thickness and hardened to form the air gap spacer under the torsion hinges. The sacrificial layer 604 is patterned to form contact opening 641 for the hinge support post 105, as shown in FIG. 18.

Figure 19:
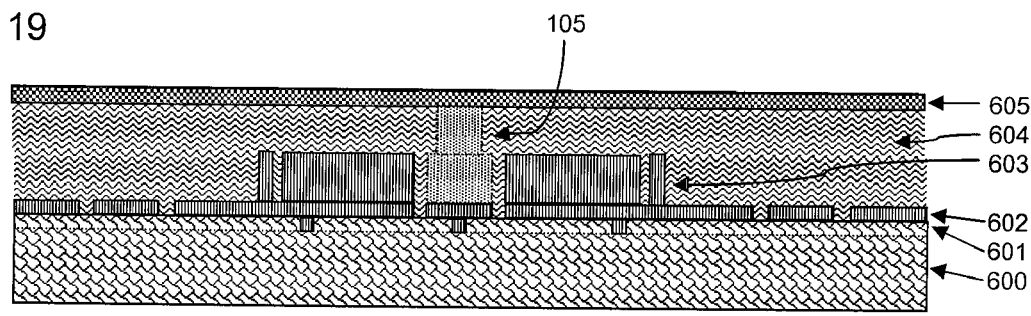

As shown in FIG. 19, an electromechanical material is deposited to fill the vias and form a hinge layer 605 on the surface, which will form the upper portion of the hinge support post 105 and the hinge 106 of the mirror plate 102. In some embodiments, the electromechanical material is amorphous silicon. Amorphous silicon can be deposited by PECVD to the fill the contact opening 641 and to form the hinge layer 605. Similar to the description above in relation with the formation of landing tips 222, step electrodes 221, and hinge support post 105, the amorphous silicon can be deposited using PECVD in a processing chamber at a temperature below 550° C. The processing chamber can be kept in the range of 100° C. to 450° C., and sometimes between 150° C. and 400° C. The exemplified temperature range can ensure that the CMOS circuit in the substrate 600 will not suffer heat-induced damage. The pressure of the processing chamber can be kept in a range from 1 to 10 Torr. SiH$_4$ gas can be blown through the chamber at a rate in the range of about 20-300 sccm. PH$_3$ gas can be blown through the chamber at a rate a rate in the range of about 20-500 sccm. Helium gas can be flown through the chamber at a rate in the range of 2000-10000 sccm. An RF field at a power of about 50-1200 Watts can be applied. An example of the process conditions for the PECVD of the amorphous silicon is shown in Table I, above.

Figure 20:
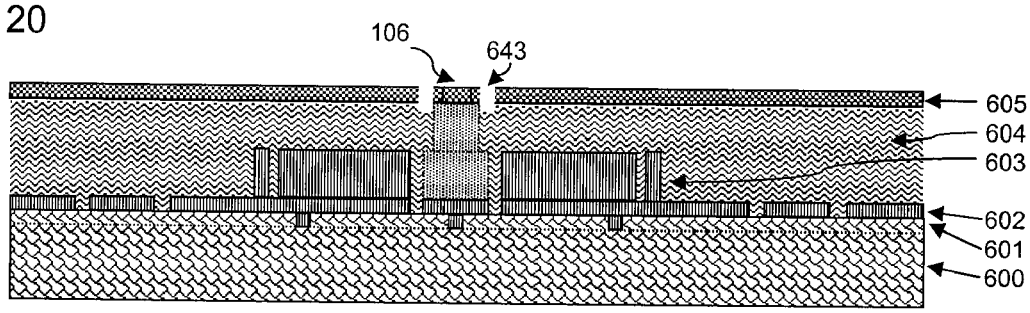
Figure 21:
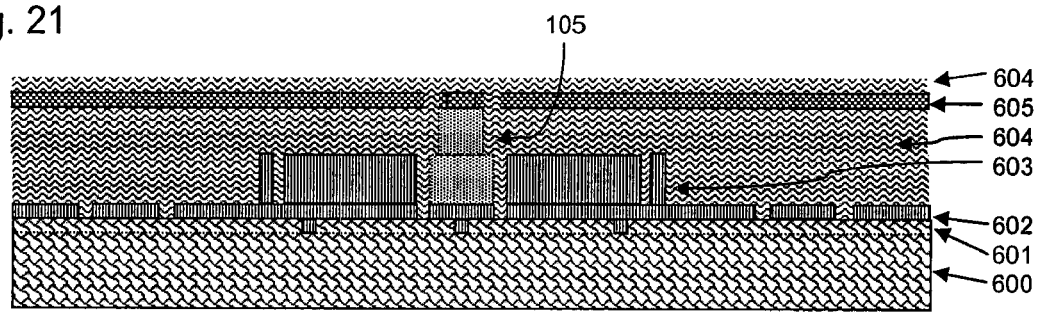
FIG. 21-23 are cross-sectional side views of a part of a spatial light modulator illustrating one method for fabricating a mirror plate with a plurality of hidden hinges.
Figure 22:
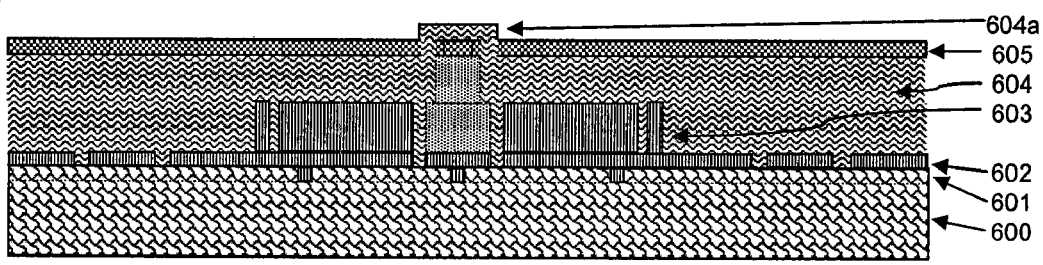

The hinge layer 605 is then planarized, such as by CMP, to a predetermined thickness. The CMP planarization can exert significant mechanical strain on a thin hinge layer 605. The thickness of the hinge layer 605 defines the thickness of the torsion hinge and the mechanical performance of the mirror plate when the device is complete. The hinge layer 605 can have a thickness in the range of about 400 to 1200 angstroms. When amorphous carbon, HSQ, or SiLK™ are used as the sacrificial materials, these materials can provide higher mechanical strength after hardening comparing to hardened photo resist. These sacrificial materials can therefore provide better support for the hinge layer 605 during planarization than photo resist and prevent damage to the hinge layer 605 during planarization The partially fabricated wafer is patterned and anisotropically etched to form openings 643, which define hinges 106 in the hinge layer 605, as shown in FIG. 20. More sacrificial material 604 is deposited to fill the openings 643, which surround each hinge, and to form a thin layer 604 with a predetermined thickness on the surface, as shown in FIG. 21. The sacrificial layer 604 is then patterned to form a plurality of spacers 604a on top of each hinge 106, as shown in FIG. 22. The thickness of layer 604 defines the height of the spacers 604a on top of each hinge 106.

Because the top surface of support post 105 is also under the cavity beneath the mirror plate 102, the air gap G in the cavity needs to be sufficient large enough to accommodate the angular rotation of mirror plate 102 without the mirror plate 102 touching the hinge support posts 105 at a pre-determined angle θ. In order for the mirror plate to rotate a pre-determined angle θ without touching the hinge support post 105, the air gap of the cavity where the hinges 106 are positioned must be greater than G=0.5×W×SIN(θ), where W is the cross-section width of hinge support post 105. In the present specification, each mirror plate in the array rotates 15° in either direction. The calculation indicates the air gap spacing G of the hinge 106 in the cavity must be greater than G=0.13 W. If width of each side W of a square hinge support post 105 is 1.0 micron, the air gap spacing G in the cavity should be greater than 0.13 microns.

Figure 23:
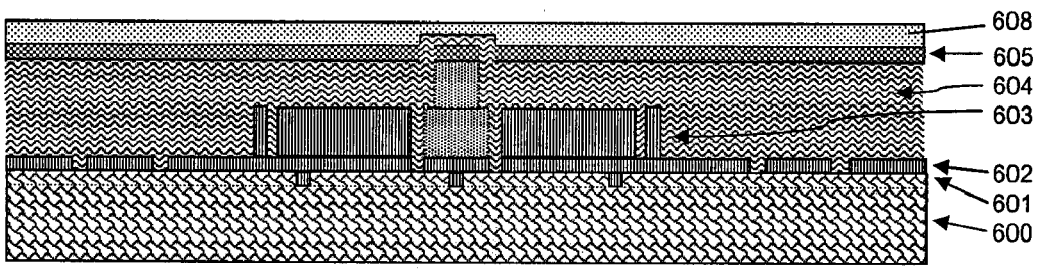

To form a mirror plate with the hinges 106 under each cavity below the mirror plate 102, more electromechanical material is deposited to form a middle plate layer 608 over the sacrificial spacer and the hinge layer 605, as shown in FIG. 23. In some embodiments, the middle plate layer 608 is formed from amorphous silicon using PECVD using processing conditions as described above.

Figure 24:
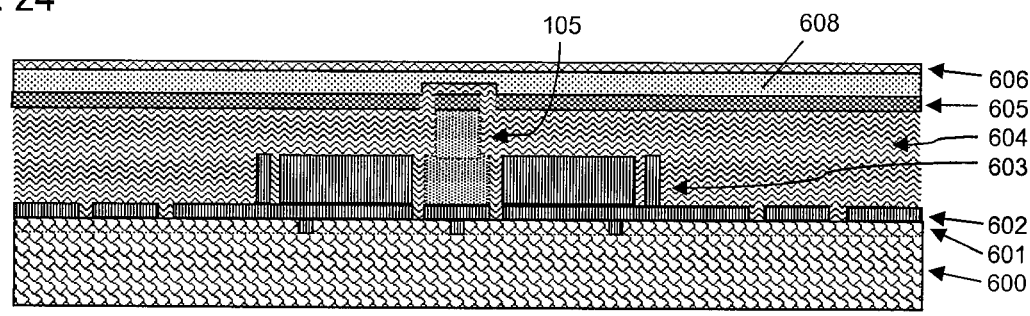
FIG. 24-26 are cross-sectional side views of a part of a spatial light modulator illustrating the formation of the mirror plate layers and the separation of the micro mirror plates.
Figure 25:
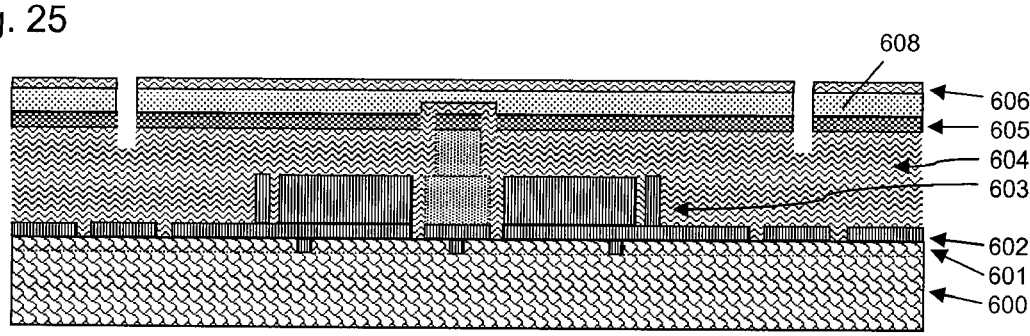

In some cases, a CMP planarization step is added to ensure a flat reflective surface of middle layer 608 has been achieved before etching to form individual mirrors. In FIG. 23, the surface of the middle plate layer 608 is planarized by CMP to a predetermined thickness. In the present specification, the thickness of mirror plate 603 can be between 0.3 microns to 0.5 microns. If the electromechanical material is aluminum or its metallic alloy, the reflectivity of the mirror is high enough for most of display applications. For some other electromechanical materials or for other applications, reflectivity of the mirror surface may be enhanced by deposition of a reflective layer 606 of about 400 angstroms or less thickness selected from the group consisting of aluminum, gold, and their alloys and combinations, as shown in FIG. 24. The reflective surface 606 of electromechanical layer is then patterned. The hinge layer 605, the middle plate layer 608, and the reflective layer 606 are anisotropically etched through to separate the layers into a plurality of individual mirror plates, as shown in FIG. 25.

Figure 26:
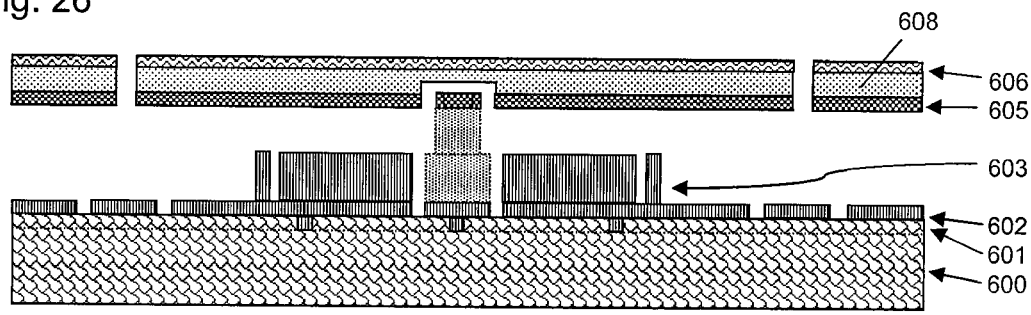

FIG. 26 shows a functional micro mirrors after the removal of the remaining sacrificial materials 604 through a plurality of air gaps and the cleaning of the residues.

The micro mirror SLM 400 fabricated in the above described process possesses several unique advantageous properties. First, as described above, the middle plate layer 608, the landing tips 222, the step electrodes 221, and the hinge support post 105 can be formed of amorphous silicon at relatively low temperatures. Forming components from amorphous silicon can ensure that the CMOS circuit in the substrate 600 remains intact during the fabrication of the micro mirror. If the circuitry is damaged during processing, the CMOS circuit in the finally formed device may not function properly, if at all. Product yield can be increased when the amorphous silicon is used compared to conventional processes involving higher temperature processing steps over CMOS substrates.

Figure 28:
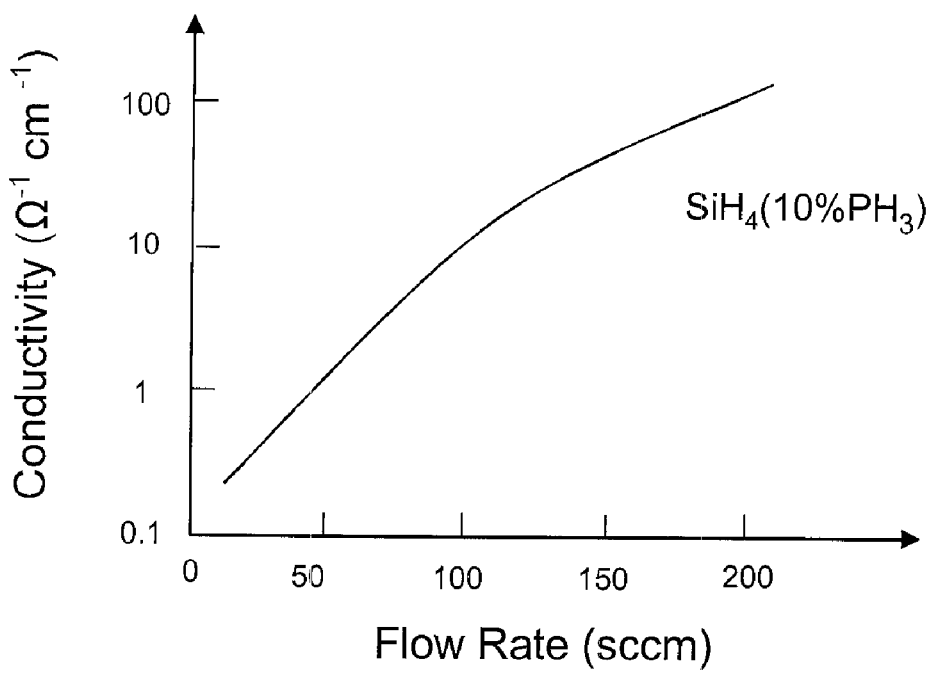
FIG. 28 is a plot illustrating the conductivity of amorphous silicon as a function of the flow rate of a $SiH_4/PH_3$ gas flow in a PECVD process.

The amorphous silicon deposited in the above described PECVD process can also be electrically conductive. The conductivity can be tailored by varying the PECVD conditions. FIG. 28 is a plot illustrating the conductivity of amorphous silicon as a function of the flow rate of a $SiH_4(90\%)/PH_3$ (10%) gas flow in a PECVD process. The conductivity of amorphous silicon can be over 10 $\Omega^{-1}cm^{-1}$ when applied using a flow rate of 150 sccm.

Figure 29:
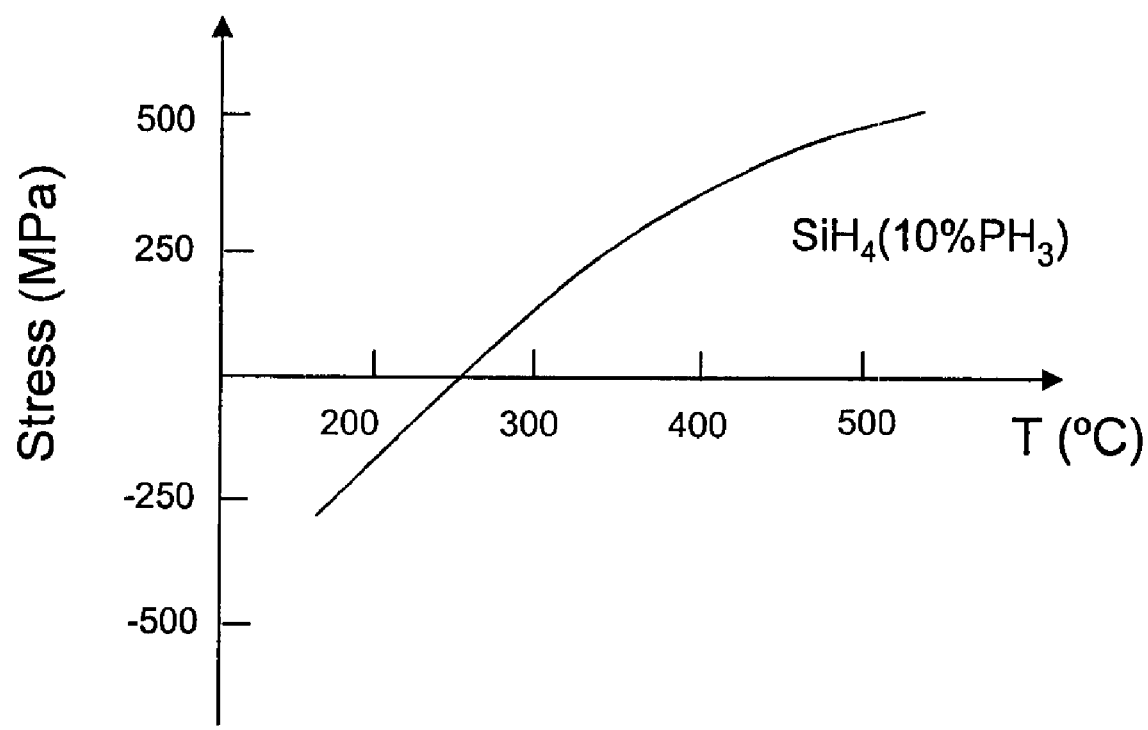
FIG. 29 illustrates the dependence of the mechanical stress of amorphous silicon as a function of the flow rate of a $SiH_4/PH_3$ gas flow in a PECVD process.

The amorphous silicon deposited in the above described PECVD process can have low mechanical stress. FIG. 29 illustrates the dependence of the mechanical stress of amorphous silicon as a function of the flow rate of a $SiH_4(90\%)/PH_3(10\%)$ gas flow in a PECVD process. As shown, the mechanical stress can be below 250 MPa at temperature near 150° C. Amorphous silicon can be formed to have a mechanical stress of between about −150 MPa and 150 MPa.

The above described micro mirror SLM 400 also has beneficial optical properties. The reflectance of amorphous Si is about 30% in the visible spectrum. The low reflectance is important for reducing unwanted optical reflections and scattering by surfaces other than the reflective layer 606 in the mirror plate 102.

The PECVD deposited amorphous silicon has a set of beneficial properties that are unique advantageous compared to conventional fabrication process. For example, although metallic materials such as aluminum can be deposited at lower temperatures, these materials typically have high optical reflectance. For instance, the reflectance of aluminum is about 90% in the visible spectrum, much higher than that of amorphous silicon. In another example, oxide materials such as silicon dioxide have lower reflectance than metallic materials, but the conductivities of these materials tend to be very low. Their deposition temperatures are typically in the range of 400-600° C., higher than the temperature range for amorphous silicon deposition using PECVD. Another popular material, poly-silicon, is also typically deposited in the temperature range of 400-600° C. Moreover, poly-silicon is not electrically conductive.

Figure 30A:
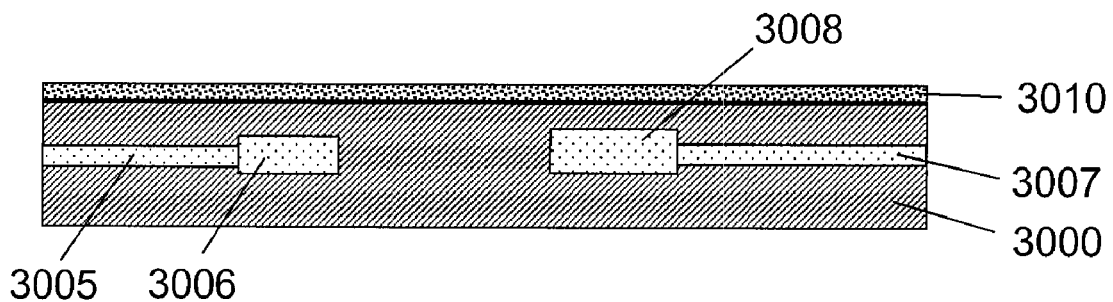
FIGS. 30A-30H are cross-sectional views of a cantilever at different steps of a manufacturing process.

In another example, FIGS. 30A-30H illustrate a manufacturing process for fabricating a cantilever 3080 using one or more of the disclosed sacrificial materials. As shown in FIG. 30A, a substrate 3000 includes an electric circuit 3005 for controlling the electric potential of the cantilever to be formed. The electric circuit 3005 can include an electric pad 3006 that can provide the electric contact with the cantilever. The substrate 3000 also includes an electric circuit 3007 for controlling an electrode 3009 (shown in FIG. 30C) to be formed over an upper surface of the substrate 3000. The electric circuit 3007 also includes an electric pad 3008 to make electrical contact with the electrode 3009. The substrate 3000 and the electric circuits 3005 and 3007 can be fabricated using silicon or complementary metal oxide semiconductor (CMOS) materials. A layer 3010 of silicon nitride is deposited on a substrate 3000.

Figure 30B:
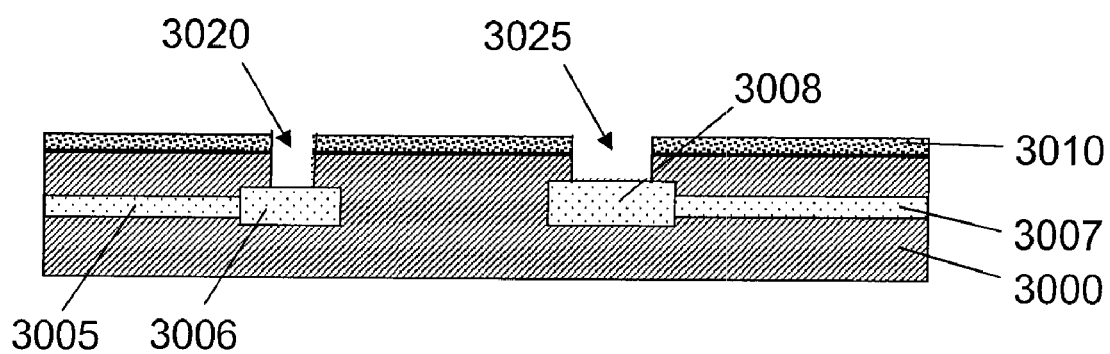
Figure 30C:
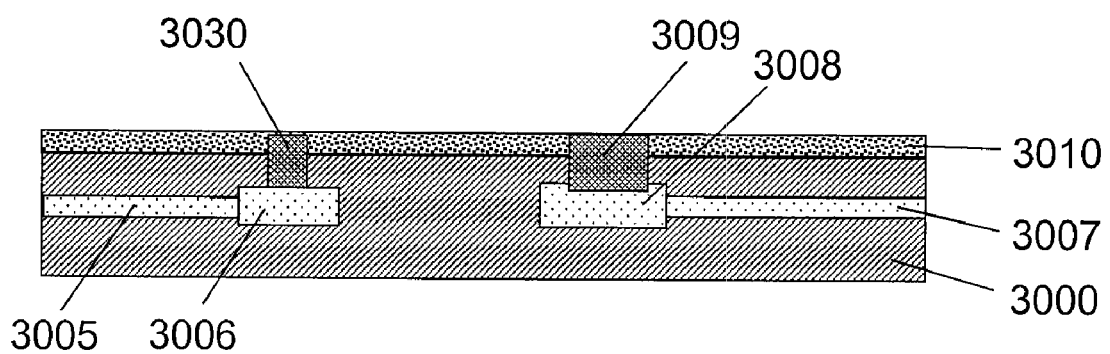

A via hole 3020 and a recess 3025 are etched through the layer 3010 and into the substrate 3000 to expose the electric pads 3006 and 3008, as shown in FIG. 30B. The etching can be implemented by a standard semiconductor process: spin-coating a layer of photo resist, forming a patterned photo mask, and selectively removing the material in the layer 3010 and the substrate 3000 that is not covered by the photo mask, and finally the removal of the photo mask. The via hole 3020 is then filled with an electrically conductive material 3030 such as tungsten, as shown in FIG. 30C. The electrically conductive material 3030 forms a conductive connection with the electric pad 3006 in the electric circuit 3005. The recess 3025 is also filled with the same electrically conductive material to form a surface electrode 3009. The layer 3010, electrically conductive material 3030, and the surface electrode 3009 can then be planarized by CMP.

Figure 30D:
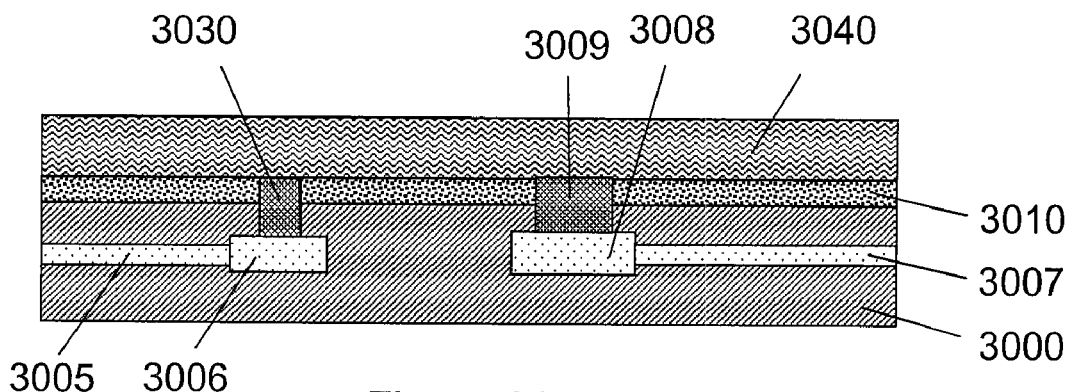

A layer of sacrificial material 3040 is next introduced over the layer 3010, the electrically conductive material 3030, and the surface electrode 3009, as shown in FIG. 30D. The sacrificial material 3030 can include amorphous carbon, SiLK™, HSQ, or a photo resist. As described previously, the amorphous carbon can be deposited by CVD or PECVD. The polyarylene, polyarylene ether, and hydrogen silsesquioxane can be spin-coated on the surface. The deposited amorphous carbon can harden by thermal annealing. SiLK™ or HSQ can be hardened by UV exposure and optionally thermal and plasma treatments. The sacrificial material 3030 based on the photoresist material can be spin-coated and hardened by UV exposure, or thermal or plasma treatments.

Figure 30E:
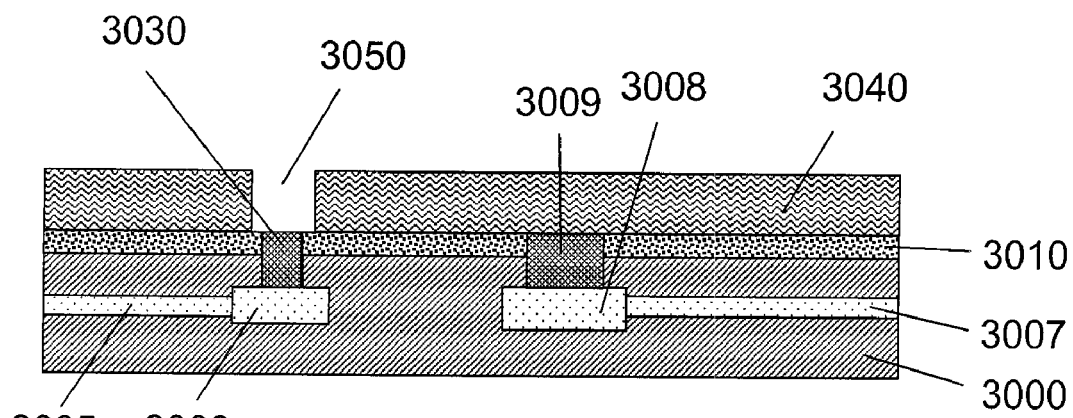

A recess hole 3050 is next etched in the layer of sacrificial material 3040 using standard semiconductor etching process to expose the upper surface of the electrically conductive material 3030, as shown in FIG. 30E.

Figure 30F:
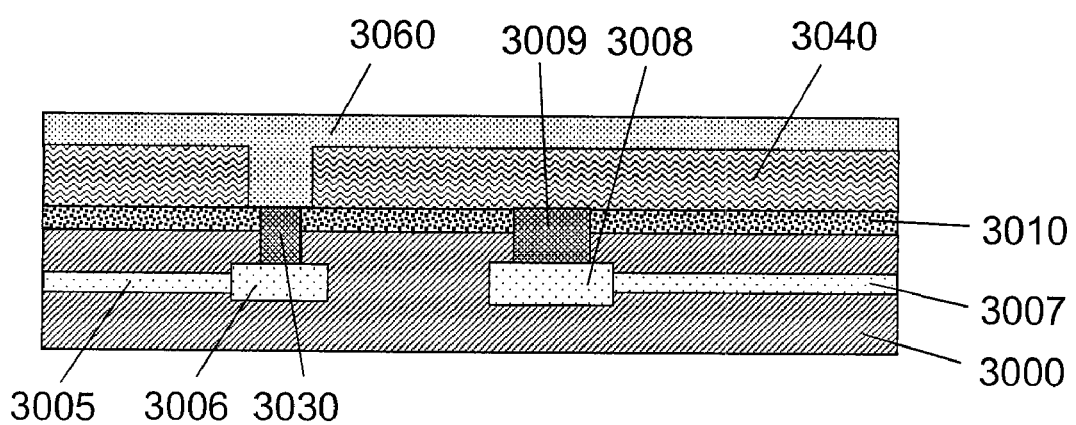

Amorphous silicon is then deposited in a processing chamber using PECVD to fill the recess hole 3050 and to form a cantilever layer 3060 over the layer of sacrificial material 3040, as shown in FIG. 30F. The exemplified conditions of the processing chamber during the deposition include a gas pressure of 1 to 10 Torr in the processing chamber, $SiH_4$ gas flow at a rate in the range of 20-300 sccm, $PH_3$ gas flow at a rate in the range of 20-500 sccm, helium gas flow at a rate in the range of 2000-10000 sccm, and an RF power of 50-1200 Watts. The processing temperature is typically below 550° C. For example, the processing temperature can be in the range of 100° C. to 450° C. The range of processing temperatures is selected such that the electric circuits 3005 and 3007 will not incur heat-related damages during the formation of the cantilever layer 3060.

Figure 30G:
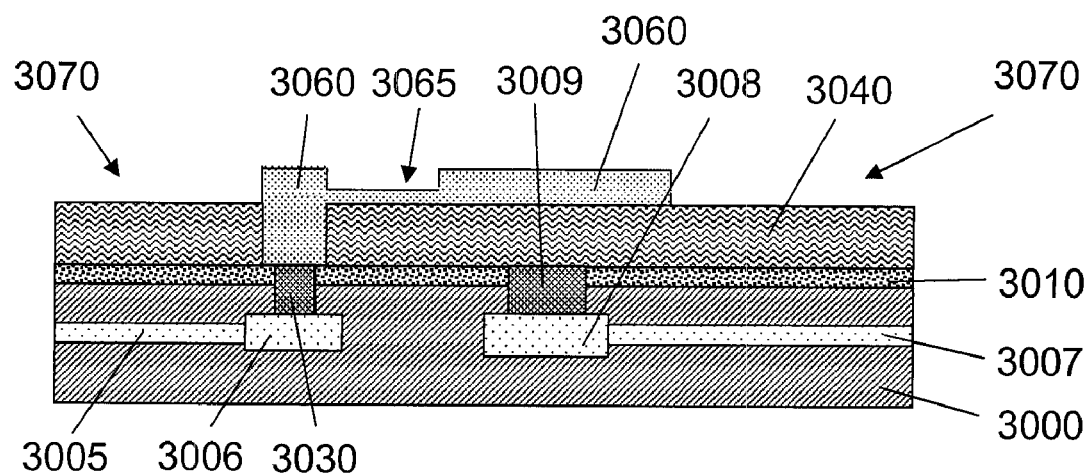
Figure 30H:
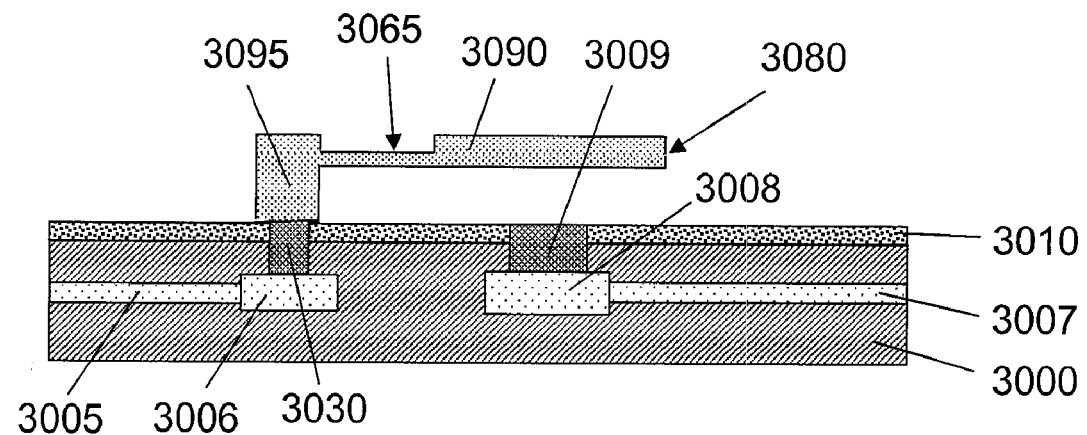

The amorphous silicon in the cantilever layer 3060 is then etched in areas 3070 to expose the upper surface of the layer of sacrificial material 3040, as shown in FIG. 30G. The amorphous silicon in the cantilever layer 3060 is also etched to form a recessed area 3065. The sacrificial material 3040 is finally removed using dry processes, such as isotropic plasma etching, microwave plasma, or activated gas vapor, to form a cantilever 3080 above the substrate 3000, as shown in FIG. 30H.

The cantilever 3080 includes a cantilever layer 3090 and a cantilever support post 3095. The cantilever layer 3090 includes a recess area 3065. The thin segment of the cantilever layer 3090 under the recess area 3065 makes the cantilever 3090 easy to flex under external forces The control circuit 3005 in the substrate 3000 can control the electric potential of the cantilever plate 3090 through the electric pad 3006, the electric conductive material 3030, and the cantilever post 3095. The electric circuit 3007 can control the electric potential of the electrode 3009. An electric voltage can be produced between the cantilever plate 3090 and the electrode 3009 by separately setting their electric potentials by the electric circuits 3005 and 3007. The resulted electrostatic force can move the cantilever plate 3090 toward or away from the substrate 3000.

Although multiple embodiments have been shown and described, it will be understood by persons skilled in the relevant art that various changes in form and details can be made therein without departing from the spirit and scope. The disclosed sacrificial materials can be applied to many other types of micro devices in addition to the examples described above. For example, the disclosed sacrificial materials and the methods can be used to form micro mechanical devices, micro electrical mechanical devices (MEMS), microfluidic devices, micro sensors, micro actuators, micro display devices, printing devices, and optical waveguide. The disclosed sacrificial materials and the methods are generally suitable for the fabrication of micro devices comprising cavities, recesses, micro bridges, micro tunnels, or overhanging micro structures, such as cantilevers. The disclosed sacrificial materials and methods can be advantageously applied to fabricate such micro devices over substrates that contain electronic circuits. Furthermore, the disclosed sacrificial materials and methods are particularly suitable to fabricate micro devices over substrates containing electronic circuit wherein high processing is required.

What is claimed is:

1. A device, comprising:
    a substrate having an electrical circuit, wherein the electrical circuit is a CMOS circuit; and
    a microelectromechanical structure on the substrate, wherein the microelectromechanical structure has a moveable portion that is moveable with respect to the substrate, and the moveable portion has a portion formed of amorphous silicon and is configured to electrically communicate with the electrical circuit.

2. The device of claim 1, wherein the portion of the microelectromechanical structure formed of the amorphous silicon is characterized by one or more of an electric conductivity in the range 0.1 to 100 $\Omega^{-1}$ cm$^{-1}$, a reflectance below 50%, or a mechanical stress between about −250 MPa and about 250 MPa.

3. The device of claim 1, wherein the portion of the microelectromechanical structure formed of the amorphous silicon is characterized by one or more of an electric conductivity in the range of 0.5 to 100 $\Omega^{-1}$cm$^{-1}$, a reflectance below 40%, or a mechanical stress between about −150 MPa and about 150 MPa.

4. The device of claim 1, further comprising an electrode on the substrate, wherein the moveable portion of the microelectromechanical structure is actuatable to move when an electric voltage is applied between the moveable portion and the electrode on the substrate.

* * * * *

UNITED STATES PATENT AND TRADEMARK OFFICE
CERTIFICATE OF CORRECTION

PATENT NO. : 7,821,010 B2
APPLICATION NO. : 11/427272
DATED : October 26, 2010
INVENTOR(S) : Shaoher X. Pan and Chii Guang Lee Page 1 of 1

It is certified that error appears in the above-identified patent and that said Letters Patent is hereby corrected as shown below:

Column 20, claim 2, at line 10, after "range," please insert --of--

Column 20, claim 3, at line 16, please replace "$cm^{-1}$ ," with --$cm^{-1}$,--

Signed and Sealed this
Twenty-sixth Day of April, 2011

David J. Kappos
*Director of the United States Patent and Trademark Office*